United States Patent
Lennen

(10) Patent No.: US 11,463,071 B2
(45) Date of Patent: Oct. 4, 2022

(54) ASYMMETRICAL FILTERING TO IMPROVE GNSS PERFORMANCE IN PRESENCE OF WIDEBAND INTERFERENCE

(71) Applicant: Samsung Electronics Co., Ltd., Gyeonggi-do (KR)

(72) Inventor: Gary Lennen, Cupertino, CA (US)

(73) Assignee: Samsung Electronics Co,. Ltd

( * ) Notice: Subject to any disclaimer, the term of this patent is extended or adjusted under 35 U.S.C. 154(b) by 325 days.

(21) Appl. No.: 16/042,811

(22) Filed: Jul. 23, 2018

(65) Prior Publication Data

US 2019/0326886 A1 Oct. 24, 2019

Related U.S. Application Data

(60) Provisional application No. 62/661,380, filed on Apr. 23, 2018.

(51) Int. Cl.
*H03H 19/00* (2006.01)
*G01S 19/39* (2010.01)
*H03D 7/16* (2006.01)

(52) U.S. Cl.
CPC .......... *H03H 19/002* (2013.01); *G01S 19/39* (2013.01); *H03D 7/165* (2013.01)

(58) Field of Classification Search
CPC ....... H03H 19/002; G01S 19/39; H03D 7/165
USPC ........................................................ 342/101
See application file for complete search history.

(56) References Cited

U.S. PATENT DOCUMENTS

| | | | |
|---|---|---|---|
| 4,267,605 A | 5/1981 | Matsuzawa et al. | |
| 5,230,011 A * | 7/1993 | Gielis | H03D 3/007 375/344 |
| 5,790,959 A | 8/1998 | Scherer | |
| 6,032,166 A | 2/2000 | Signell et al. | |
| 6,173,164 B1 | 1/2001 | Shah | |
| 6,546,061 B2 * | 4/2003 | Signell | H03H 17/0202 375/316 |
| 6,611,569 B1 | 8/2003 | Schier et al. | |
| 7,116,965 B2 * | 10/2006 | Minnis | H03D 3/007 455/323 |

(Continued)

FOREIGN PATENT DOCUMENTS

| | | | | |
|---|---|---|---|---|
| CA | 2814009 A1 * | 4/2012 | ............. | G01S 11/10 |
| GB | 2516997 A * | 2/2015 | ............. | G01S 5/00 |
| WO | WO 2010/133049 | 11/2010 | | |

OTHER PUBLICATIONS

Olubodun, O.A. et al., Performance Impact of Asymmetric Filtered 40Gb/s RZ DPSK System—Tight Optical Filtering Considerations . . . 2012 14th International Conference on Transparent Optical Networks (ICTON), Copyright 2012 IEEE, pp. 4.

(Continued)

*Primary Examiner* — Olumide Ajibade Akonai
*Assistant Examiner* — Alexander L. Syrkin
(74) *Attorney, Agent, or Firm* — The Farrell Law Firm, P.C.

(57) ABSTRACT

A system and method for providing asymmetrical filtering to improve performance in the presence of wideband interference is herein disclosed. According to one embodiment, a method for a global navigation satellite system (GNSS) receiver includes detecting wideband interference in a received target GNSS signal, and applying an asymmetric filter to the received target GNSS signal to mitigate the detected wideband interference.

20 Claims, 13 Drawing Sheets

(56) References Cited

U.S. PATENT DOCUMENTS

| | | | |
|---|---|---|---|
| 7,139,329 B2 | 11/2006 | Takahiko | |
| 7,529,788 B2 | 5/2009 | Koyanagi | |
| 8,380,771 B2* | 2/2013 | Hahn | H03H 11/1291 |
| | | | 708/309 |
| 8,553,805 B2 | 10/2013 | Monsen et al. | |
| 8,879,602 B2 | 11/2014 | Brisebois | |
| 9,356,636 B1 | 5/2016 | Mak et al. | |
| 9,379,747 B2 | 6/2016 | Haub et al. | |
| 9,680,415 B2 | 6/2017 | Anderson et al. | |
| 9,871,487 B2 | 1/2018 | Lu et al. | |
| 2002/0058491 A1* | 5/2002 | Minnis | H03D 3/007 |
| | | | 455/323 |
| 2004/0023632 A1* | 2/2004 | Visee | H04B 1/28 |
| | | | 455/317 |
| 2007/0201544 A1* | 8/2007 | Zhu | H04L 25/03057 |
| | | | 375/229 |
| 2008/0107168 A1* | 5/2008 | Xia | H04L 25/03057 |
| | | | 375/233 |
| 2009/0135973 A1* | 5/2009 | He | H04L 5/26 |
| | | | 375/350 |
| 2009/0323779 A1* | 12/2009 | Lennen | H04B 1/71 |
| | | | 375/148 |
| 2010/0118921 A1* | 5/2010 | Abdelmonem | H04W 88/10 |
| | | | 375/148 |
| 2011/0294454 A1* | 12/2011 | Robert | H03H 7/0153 |
| | | | 455/323 |
| 2013/0196609 A1* | 8/2013 | Ancora | H04B 15/04 |
| | | | 455/78 |
| 2014/0219405 A1* | 8/2014 | Nienaber | H04B 1/16 |
| | | | 375/350 |
| 2014/0269850 A1* | 9/2014 | Abdelmonem | H04L 5/0073 |
| | | | 375/148 |
| 2014/0270021 A1* | 9/2014 | McKay | H04B 1/1027 |
| | | | 375/350 |
| 2014/0350872 A1* | 11/2014 | Xu | H03M 1/12 |
| | | | 702/60 |
| 2014/0369452 A1* | 12/2014 | Dubash | G01S 5/00 |
| | | | 375/350 |
| 2015/0065064 A1* | 3/2015 | Hwang | H04B 1/525 |
| | | | 455/78 |
| 2016/0050031 A1* | 2/2016 | Hwang | H04L 25/08 |
| | | | 375/219 |
| 2016/0211882 A1* | 7/2016 | Hwang | H04B 1/126 |
| 2016/0380618 A1 | 12/2016 | Lu et al. | |
| 2017/0350985 A1 | 12/2017 | Agee | |
| 2020/0166652 A1* | 5/2020 | Agee | G01S 19/36 |

OTHER PUBLICATIONS

Global positioning systems directorate systems engineering & integration—Interface specification IS-GPS-800D, Navstar GPS Space Segment/User Segment L1C Interface, Sep. 24, 2013, 127 pages.
European GNSS (Galileo) open service, Signal in space Interface Control Document, European Union 2016, version 1.3, Dec. 2016, 88 pages.
Indian Space Research Organization, Indian Regional Navigation Satellite System, Signal in Space ICD for Standard Positioning Service, Version 1.1, Aug. 2017, 72 pages.
Global Navigation Sattelite System, Glonass, Interface Control Document, Navigational radiosignal in bands L1, L2, (Edition 5.1) Moscow 2008, 65 pages.
BeiDou navigation satellite system—Signal in space interface control document, Open service signal B1l, China Satellite Navigation Office, version 1.0, Dec. 2012, 81 page.
Global positioning systems directorate systems engineering & integration—Interface Specification IS-GPS-200H, Navstar GPS Space Segment/Navigation User Interfaces, Sep. 24, 2013, 226 pages.
The Cabinet Office, Government of Japan ("CAO") and Quasi-Zenith Satellite Systems Services Inc., Quasi-Zenith Satellite System Interface Specification Satellite Positioning, Navigation and Timing Service, Mar. 28, 2017, 148 pages.
Global positioning systems directorate systems engineering & integration—Interface Specification IS-GPS-705D, Navstar GPS Space Segment/User Segment L5 Interfaces, Sep. 24, 2013, 104 pages.
Chaouch, Hacene et al., BER Improvement for RZ-DPSK Receivers Using Saturated Asymmetric Filtering, Conference Paper • Mar. 2010, OSA / OFC/NFOEC 2010, 4 pages.
Olubodun, O.A. et al., Performance Impact of Asymmetric Filtered 40Gb/s RZ DPSK System—Tight Optical Filtering Considerations, ICTON 2012, 4 pages.
Murray, N.J. et al., Performance Enhancement of Partial-42.7 GB/s DPSK via an Asymmetrical Receiver Design, ICTON 2013, 4 pages.
Khatri, Vishal et al., Complex filter based spectrum sensor for narrowband detection over a wide sensing bandwidth, CONECCT 2015, 4 pages.
Yi, Zhao et al., A Sub-sampling 4.25GS/s 3-bit Flash ADC with Asymmetric Spatial Filter Response, RFIT2011—IEEE International Symposium on Radio-Frequency Integration Technology, Nov. 30-Dec. 2, 2011, Beijing. China, 4 pages.
Korean Office Action dated Aug. 2, 2022 issued in counterpart application No. 10-2018-0105755, 4 pages.

\* cited by examiner

ASYMMETRICAL FILTERING TO IMPROVE GNSS PERFORMANCE IN PRESENCE OF WIDEBAND INTERFERENCE

PRIORITY

This application is based on and claims priority under 35 U.S.C. § 119(e) to U.S. Provisional Patent Application Ser. No. 62/661,380 filed on Apr. 23, 2018, the entire disclosure of which is incorporated herein by reference.

FIELD

The present disclosure relates generally to navigation systems, and more particularly, to providing performance improvement in global navigation satellite system (GNSS) receivers via asymmetrical filtering, particularly in the presence of wideband interference.

BACKGROUND

Satellite navigational systems provide positional and timing information to earth-bound receivers, sometimes referred to as position, velocity, and timing (PVT) and/or position, navigation, and timing (PNT) measurements. Each system has its own constellation of satellites orbiting the Earth, and, in order to calculate its position, a receiver on Earth uses the satellites "in view" (i.e., in the sky above) from that system's constellation. GNSS is often used as the generic term for such a system, even though such navigational satellite systems include regional and augmented systems—i.e., systems that are not truly "global." The term "GNSS," as used herein, covers any type of navigational satellite system, global, regional, augmented or otherwise, unless expressly indicated otherwise.

SUMMARY

According to one aspect of the present disclosure, a method is provided for a global navigation satellite system (GNSS) receiver, including detecting wideband interference in a received target GNSS signal and applying an asymmetric filter to the received target GNSS signal to mitigate the detected wideband interference.

According to another aspect of the present disclosure, an apparatus is provided, which includes one or more non-transitory computer-readable media; and at least one processor which, when executing instructions stored on one or more non-transitory computer readable media, performs the steps of detecting wideband interference in a received target GNSS signal and applying an asymmetric filter to the received target GNSS signal to mitigate the detected wideband interference.

BRIEF DESCRIPTION OF THE DRAWINGS

The above and other aspects, features, and advantages of certain embodiments of the present disclosure will be more apparent from the following detailed description taken in conjunction with the accompanying drawings, in which.

DETAILED DESCRIPTION

Figure 1:
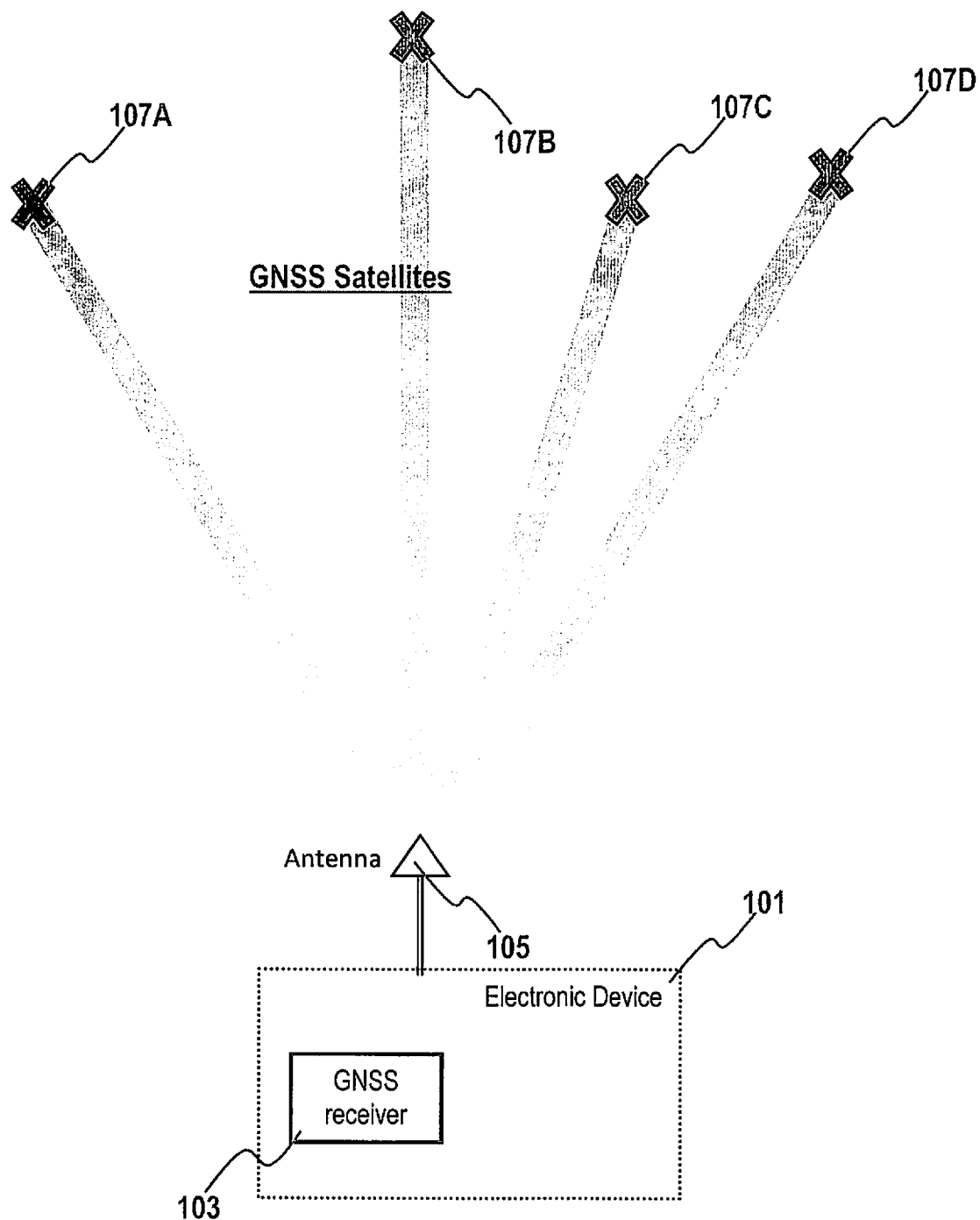
FIG. 1 illustrates an exemplary block diagram of a GNSS receiver receiving GNSS signals, according to one embodiment.

Hereinafter, embodiments of the present disclosure are described in detail with reference to the accompanying drawings. It should be noted that the same elements are designated by the same reference numerals although they are shown in different drawings. In the following description, specific details such as detailed configurations and components are merely provided to assist in the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or custom. Therefore, the definitions of the terms should be determined based on the contents throughout the specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although terms including an ordinal number such as first and second may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

Various embodiments may include one or more elements. An element may include any structure arranged to perform certain operations. Although one embodiment may be described with a limited number of elements in a certain arrangement by way of example, the embodiment may include more or less elements in alternate arrangements as desired for a given implementation. It is worthy to note that any reference to "one embodiment" or "an embodiment" means that a particular feature, structure, or characteristic described in connection with the embodiment is included in at least one embodiment. The appearance of the phrase "one embodiment" (or "an embodiment") in various places in this specification does not necessarily refer to the same embodiment.

FIG. 1 is an exemplary block diagram of a GNSS receiver receiving GNSS signals, according to one embodiment.

Referring to FIG. 1, electronic device 101 includes GNSS receiver 103 and antenna 105, which is capable of receiving signals from GNSS satellites 107A, 107B, 107C, and 107D, which may be from one or more GNSS systems. The number of GNSS systems, both planned and presently operational, is growing. These include the widely-known, widely-used, and truly global global positioning system (GPS) of the United States, Russia's GLObalnaya NAvigatsionnaya Sputnikovaya Sistema (GLONASS), Europe's Galileo system, and China's BeiDou systems—each of which has, or will have, its own constellation of satellites orbiting the entire globe.

Regional systems (those that are not global, but intended to cover only a certain region of the globe) include Japan's Quasi-zenith satellite system (QZSS) and the Indian regional navigational satellite system (IRNSS) also currently being developed. Satellite-based augmentation systems (SBASs), which are normally regional as well, "augment" existing GNSS systems with, e.g., messages from ground-based stations and/or additional navigational aids, are also continually developing and expanding.

On the receiving side, GNSS capabilities are no longer limited to any particular type of system or device. Electronic device 101 in which GNSS receiver 103 is implemented may be a mobile terminal, a tablet computer, a camera, a portable music player, and a myriad of other portable and/or mobile personal consumer devices, as well as integrated into larger devices and/or systems, such as the electronics of a vehicle. Moreover, multi-constellation GNSS receivers are being developed which receive signals from more than one satellite constellation (e.g., two or more of GPS, Galileo, GLONASS, BeiDou, regional systems, and/or augmentation system constellations) and provide much greater accuracy because the number of unblocked satellites, sometimes referred to as satellite/space vehicles (SVs), in view at any time from several constellations is always greater than the number of SVs in view from a single constellation.

The term "GNSS receiver" as used herein, covers any such implementation of GNSS capabilities in a device or system.

Although some of the descriptions herein uses GPS signals as examples, the present disclosure is not limited thereto, and multiple other embodiments are possible, including, for example, embodiments using the BeiDou signal codes, the Galileo E1 signal codes, and/or the QZSS L1C signal codes. For more detailed descriptions of some, but not all, GNSS signals, including regional systems, to which embodiments of the present disclosure are applicable, see, e.g., Global positioning systems directorate systems engineering & integration—Interface specification IS-GPS-200H (Sep. 24, 2013), describing the GPS L1 coarse/acquisition (C/A), L2C, and P channels/codes (hereinafter referred to generally as "IS-GPS-200"); Global positioning systems directorate systems engineering & integration— Interface specification IS-GPS-800D (Sep. 24, 2013), describing the GPS LIC channel/code (hereinafter referred to generally as "IS-GPS-800"); Global positioning systems directorate systems engineering & integration—Interface specification IS-GPS-705 (Sep. 24, 2013), describing the GPS L5 channel/code (hereinafter referred to generally as "IS-GPS-705"); Global navigation satellite system—GLONASS—Interface control document—Navigational radio signal in bands L1, L2 (Edition 5.1) (2008) (hereinafter referred to generally as "GLONASS L1,L2 ICD"); European GNSS (Galileo) open service—Signal in space interface control document (version 1.3) (2016) (hereinafter referred to generally as "Galileo OS-SIS-ICD"); BeiDou navigation satellite system—Signal in space interface control document—Open service signal BII (version 1.0) (December 2012) (hereinafter referred to generally as "BeiDou ICD"); Quasi-zenith satellite system—Interface specification—Satellite positioning, navigation and timing service (hereinafter referred to generally as "IS-QZSS-PNT-001"); and Indian regional navigation satellite system—Signal in space ICD for standard positioning service (version 1.1) (hereinafter referred to generally as "ISRO-IRNSS-ICD-SPS-1.1"), all of which are incorporated herein by reference in their entirety.

Moreover, embodiments of the present disclosure are equally applicable to GNSSs assisted or augmented by SBASs, such as wide area augmentation system (WAAS), European geostationary navigation overlay service (EGNOS), multi-functional satellite augmentation system (MSAS), GPS aided geo augmented navigation (GAGAN), and the "assisted" GNSS (A-GNSS) technology being developed for, e.g., measurement/testing of signals in cellular telecommunication systems (see $3^{rd}$ generation partnership project (3GPP) technical specification 3GPP TS 37.571: Universal terrestrial radio access (UTRA) and evolved UTRA (E-UTRA) and evolved packet core (EPC); user equipment (UE) conformance specification for UE positioning, which has five parts, all of which are incorporated herein by reference).

Accordingly, one of ordinary skill in the art would recognize the applicability of the present disclosure to a variety of signals from any global or regional GNSS, whether augmented/assisted or not. Moreover, and as also would be understood by one of ordinary skill in the art, "channels," "bands," and "codes" may sometimes be used herein interchangeably, as many GNSS signals are transmitted on the same channel (i.e., same frequency, same time) or band (i.e., frequency bandwidth), but with different codes, which effectively makes them different "channels," in the more general sense of the term.

The present disclosure is generally related to GNSS receivers. In particular, the present disclosure is related to a system and method for asymmetric filtering to improve GNSS receiver performance in the presence of wideband interference.

GNSS receivers are susceptible to wideband interference from known and unknown sources. Newly defined modem signals tend to be wideband and are therefore even more susceptible to suffering from wideband interference. To use a presently existing source as an example, cellular communication long term evolution (LTE) bands 13 and 14 cause wideband interference for GNSS signals.

More specifically, as shown in Table 1 below, second harmonics of the LTE band 13 and 14 transmissions may cause the interference impact of the center frequency 1575.42 MHz which is used for transmitting many GNSS signals. This problem is exacerbated by the fact that many hand-held electronic devices often both receive GNSS signals and transmit and receive cellular signals, such as those in LTE bands 13 and 14.

TABLE 1

| LTE band | Channel bandwidth (MHz) | Primary band (MHz) | $2^{nd}$ harmonic (MHz) | Starting point of $2^{nd}$ harmonic wideband interference with respect to GPS $f_c$ (1575.42 MHz) |
|---|---|---|---|---|
| 13 | 5, 10 | 777-787 | 1554-1574 | −1.42 MHz |
| 14 | 5, 10 | 788-798 | 1576-1596 | +0.58 MHz |

As indicated by the last column in Table 1, the starting points for the second harmonic interference bands caused by LTE 13 and 14 are very close to center/nominal frequency 1575.42 MHz which is used for transmitting many GNSS signals.

Figure 2A:
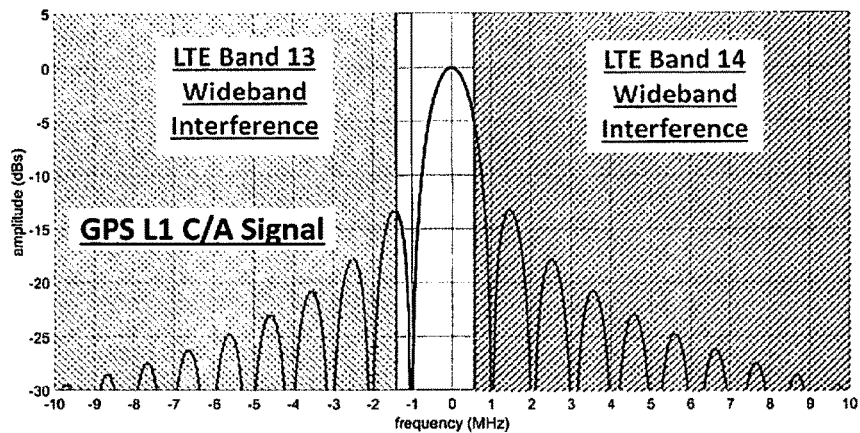
FIGS. 2A and 2B illustrate exemplary graphs showing the second harmonic wideband interference bands of LTE bands 13 and 14 in relation to the GPS L1 C/A signal and the Galileo E1 signal, respectfully, according to one embodiment.
Figure 2B:
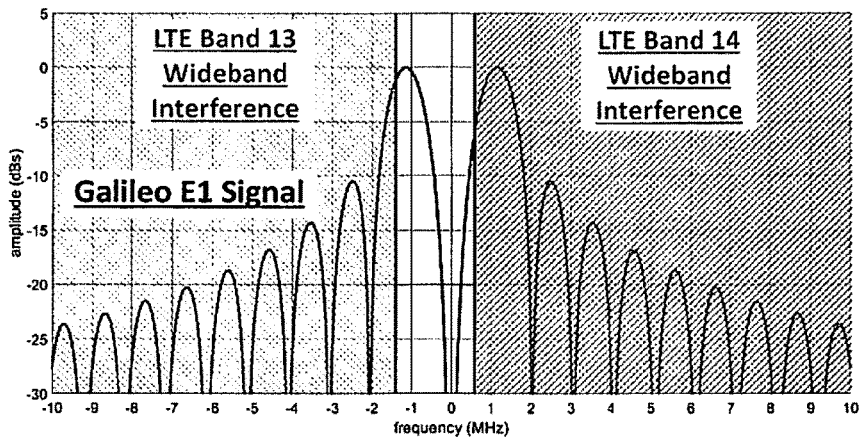

FIGS. 2A and 2B are exemplary graphs showing the second harmonic wideband interference bands of LTE bands 13 and 14 in relation to the GPS L1 C/A signal and the Galileo E1 signal, respectfully, which both use nominal frequency 1575.42 MHz (represented as the 0 point in the graphs). In FIG. 2A, the wideband interference caused by the LTE band 13 starts at −1.42 MHz, as indicated by Table 1, and continues beyond the graph, and the wideband interference caused by the LTE band 14 starts at +0.58 MHz, as indicated by Table 1, and continues beyond the graph. Similarly, in FIG. 2B, the Galileo E1 signal uses a binary offset carrier (BOC) modulated signal (specifically, BOC(1, 1)), which is seen with the wideband interference caused by the LTE band 13 and LTE band 14.

Figure 2C:
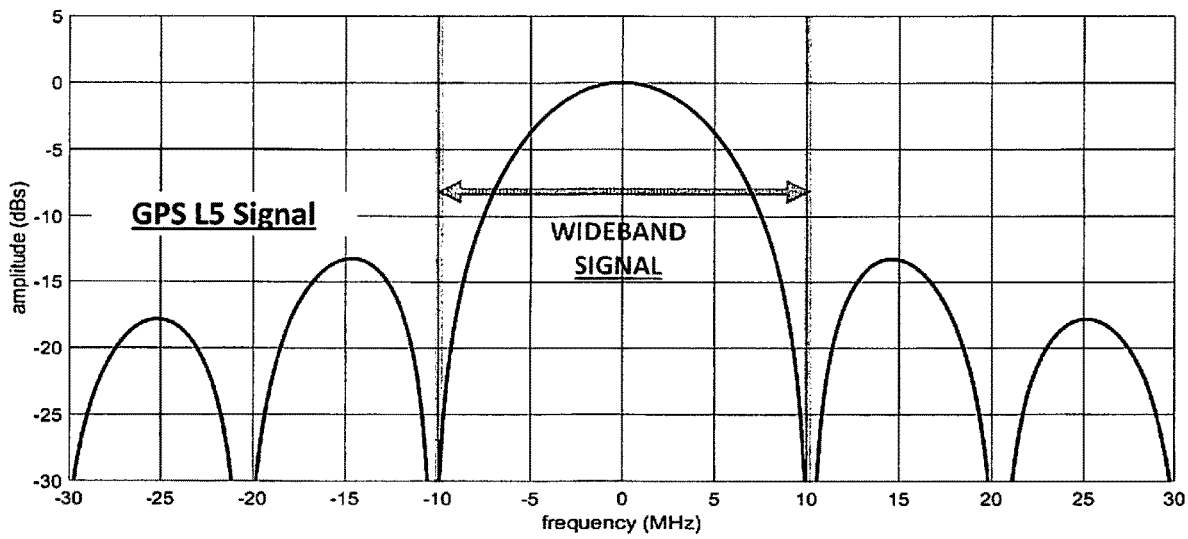
FIG. 2C illustrates an exemplary graph showing the relatively wideband GPS L5 signal, according to one embodiment.

FIG. 2C is an exemplary graph showing the GPS L5 signal. See, e.g., IS-GPS-705. Unlike the GPS L1 C/A signal and the Galileo E1 signal shown in FIG. 2A and FIG. 2B, respectively, the GPS L5 signal has a nominal/center frequency of 1176.45 MHz (thus the 0 point represents 1176.45 MHz in the graph of FIG. 2C), because, of course, the GPS L5 signal is in the L5 band. The GPS L5 signal is a good example of the new types of signals being adopted in GNSSs worldwide, which have a much wider bandwidth than the previous, old signals such as the GPS L1 C/A. The present disclosure is applicable to all modulation types, including the various BOCs, and is not limited in any way by the modulations discussed in reference to the specific embodiments presented herein.

In any event, as shown in FIG. 2C, the GPS L5 has a wide bandwidth signal, much wider than, e.g., GPS L1 or Galileo E1, and is thus much more susceptible to degradation due to wideband interference. Because new types of wideband GNSS signals are being developed and implemented around the world, wideband interference is a growing problem. As well as the present GNSS signals, such as GPS L1 C/A, GPS L5, Galileo E1, etc., the present disclosure applies equally to developing and future wideband GNSS signals which may require the benefits of the present disclosure even more than past and current GNSS signals in use.

Moreover, wideband interference is not limited to the harmonics of different frequency channels, such as in the examples of FIGS. 2A and 2B, but has a wide variety of presently unknown and known causes, including, but not limited to, intentional jamming, terrestrial transmissions (e.g., digital video broadcasting, radar, devices improperly using the wrong frequency bands, ultra-wideband (UWB) sources), and other satellite systems' transmissions (e.g., Iridium, Inmarsat-C). Indeed, the causes and effects of interference on GNSS signals is an active and on-going area of study. Regardless, the growing use of wideband GNSS signals require new approaches to wideband interference.

As is known to one of skill in the art, generally there is a two-step process of detecting the interference and then mitigating the interference using its detected characteristics. However, the detection step is not strictly necessary in an interference mitigation system/method such as disclosed herein, because certain interference sources are already known (such as the LTE bands 13 and 14), as well as their characteristics, in which case preset mitigation methods/systems may be used. In other words, although embodiments of the present disclosure include details of a detection stage/step, the present disclosure is neither limited to any particular manner of interference detection nor to even having a detection stage/step at all. In any event, the system/method therein describes detecting narrowband (and wideband) interference with a frequency scanner block, tracking and characterizing the detected interferers, and then using the detected characteristics and tracked properties to substantially remove it from the received GNSS signal.

Figure 3A:
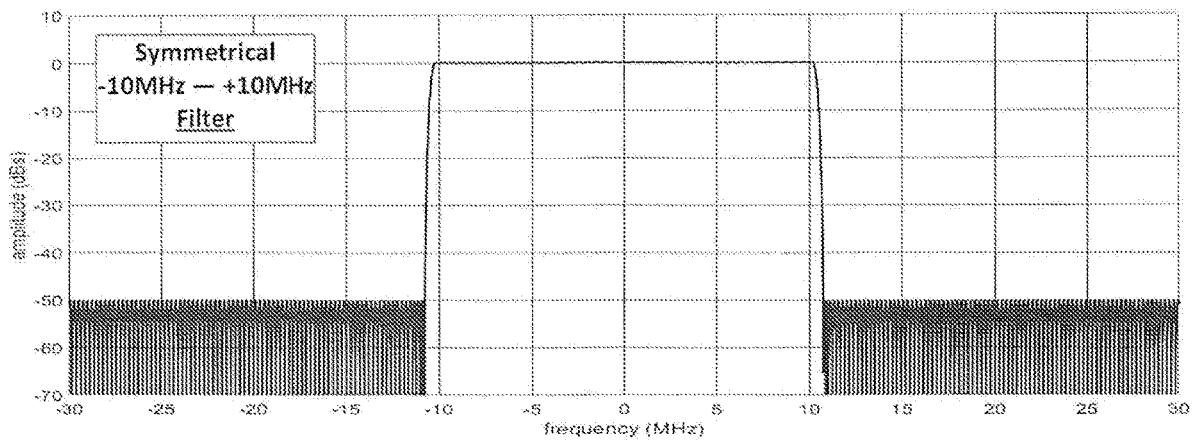
FIGS. 3A-3C illustrate exemplary plots of symmetrical filter passbands, according to one embodiment.
Figure 3B:
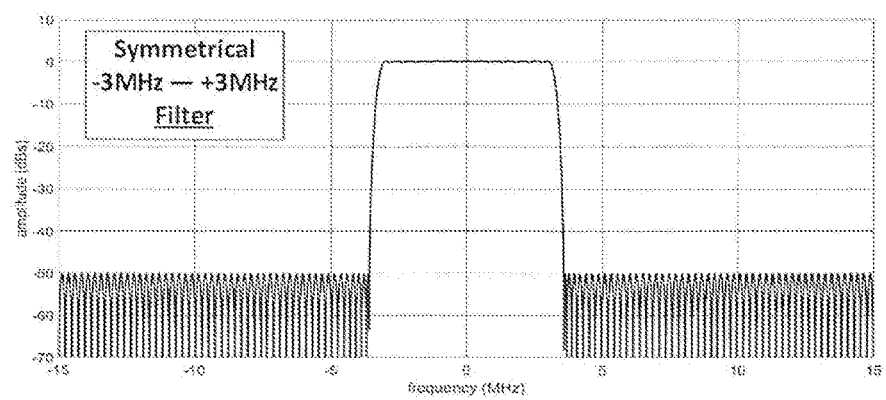
Figure 3C:
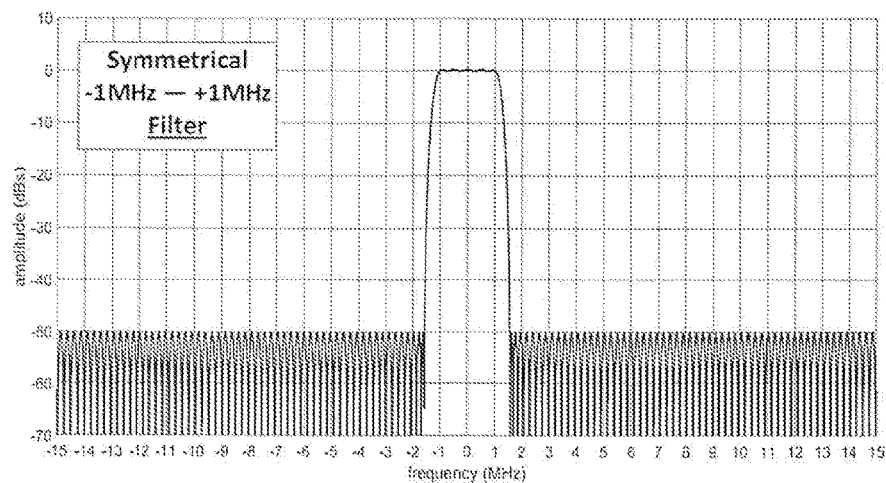

In such interference mitigation systems/methods, symmetric filters are commonly used to remove the unwanted interference signal. A symmetric filter guarantees a symmetric result, i.e., the upper half and the lower half of the received signal are identically filtered. FIGS. 3A-3C illustrate exemplary plots of symmetrical filter passbands. FIG. 3A illustrates an exemplary plot of a symmetrical filter with a passband of −10 MHz to +10 MHz, FIG. 3B illustrates an exemplary plot of a symmetrical filter with a passband of −3 MHz to +3 MHz; and FIG. 3C illustrates an exemplary plot of a symmetrical filter with a passband of −1 MHz to +1 MHz.

According to one embodiment, the present system/method provides asymmetric filtering of received GNSS signals. Such asymmetrically filtered GNSS signals are still useful in providing range and range rate measurements (with substantially the same loss of carrier to noise density ratio $C/N_0$, also referred to as "CNO" herein, as shown below in relation to Tables 2, 3, 4A, and 4B below), while effectively mitigating wideband interfering sources, which are not symmetric around the nominal frequency of the GNSS signal.

Figure 4A:
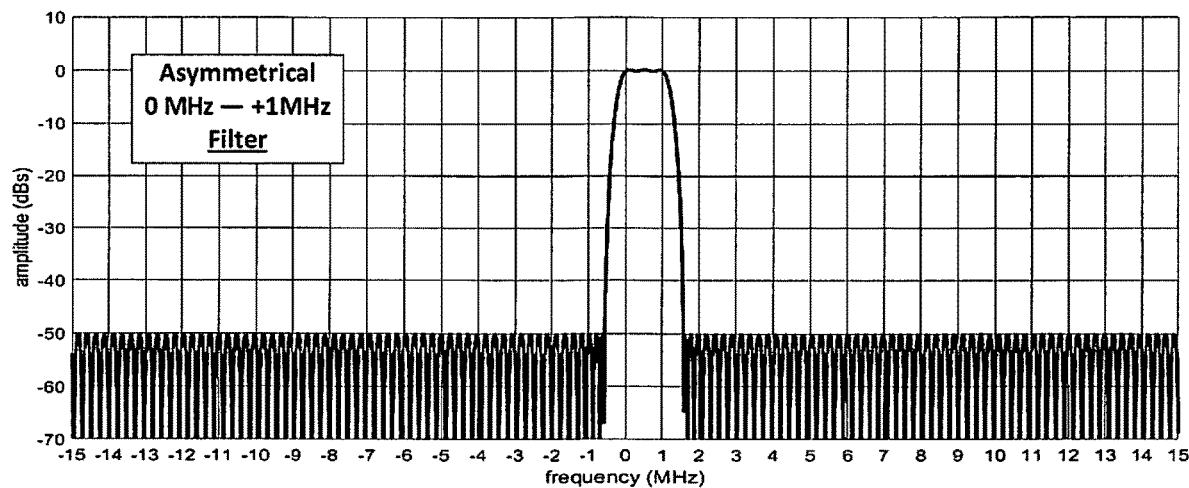
FIGS. 4A-4B illustrate exemplary plots of asymmetrical filter passbands that are particularly effective at mitigating wideband interference on the GPS L1 C/A signal, according to one embodiment.
Figure 4B:
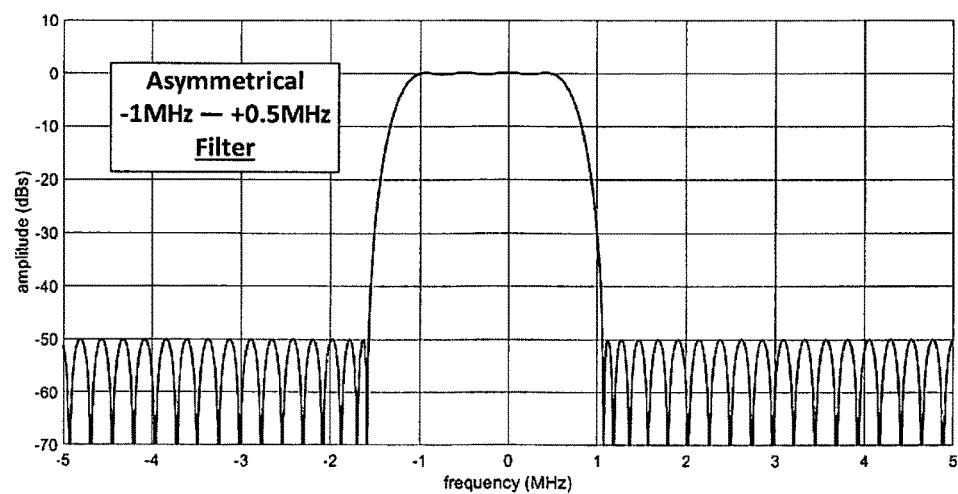

FIGS. 4A-4B illustrate exemplary plots of asymmetrical filter passbands that are particularly effective at mitigating wideband interference on the GPS L1 C/A signal. FIG. 4A illustrates an exemplary plot of an asymmetric filter with a narrow passband from 0 to +1 MHz, which can be used for wideband interference mitigation of the GPS L1 C/A signal, according to one embodiment. When compared with the LTE band 14 wideband interference shown with the GPS L1 C/A signal in FIG. 2A, one can see that a substantial portion of the LTE band 14 wideband interference would be greatly reduced by an asymmetric filter with the asymmetric narrow bandpass filter characteristic shown in FIG. 4A. FIG. 4B illustrates an exemplary plot of an asymmetric filter with a narrow passband from −1 MHz to +0.5 MHz, which can also be used for wideband interference mitigation of the GPS L1 C/A signal, according to one embodiment. When compared with the LTE band 13 wideband interference starting downward (in frequency) from −0.58 MHz and the LTE band 14 wideband interference starting from +1.42 MHz and continuing upward (in frequency) in FIG. 2A, one can see that a substantial portion of both the LTE band 13 wideband interference and the LTE band 14 wideband interference would be greatly reduced by an asymmetric filter with the asymmetric narrow bandpass filter characteristic shown in FIG. 4B.

Figure 5A:
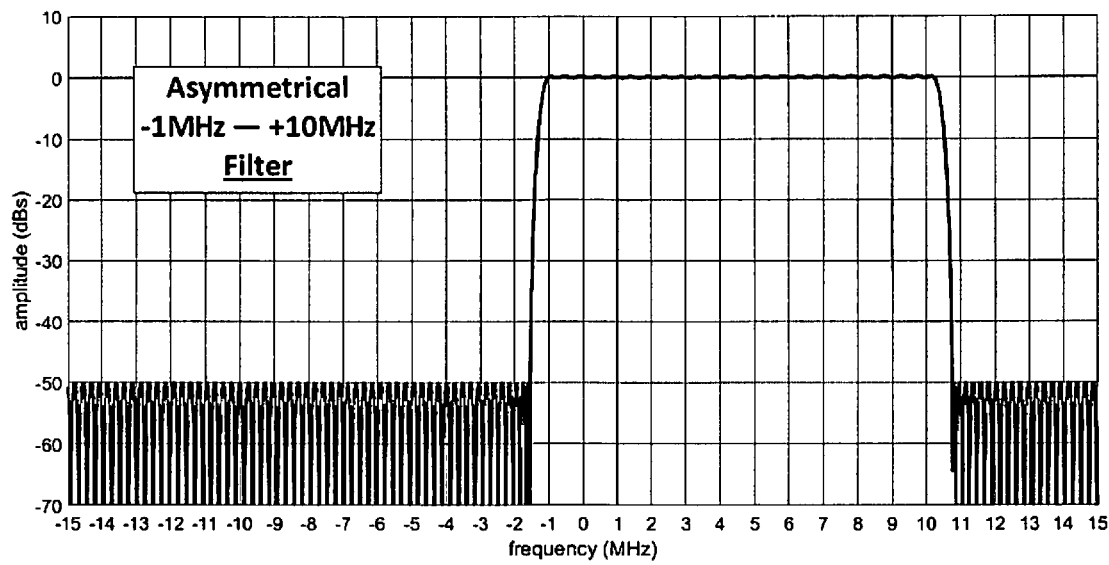
FIGS. 5A-5B illustrate exemplary plots of asymmetrical filter passbands that are particularly effective with isolating either the lower vestigial sideband or the upper vestigial sideband of the GPS L1 C/A signal, according to one embodiment.
Figure 5B:
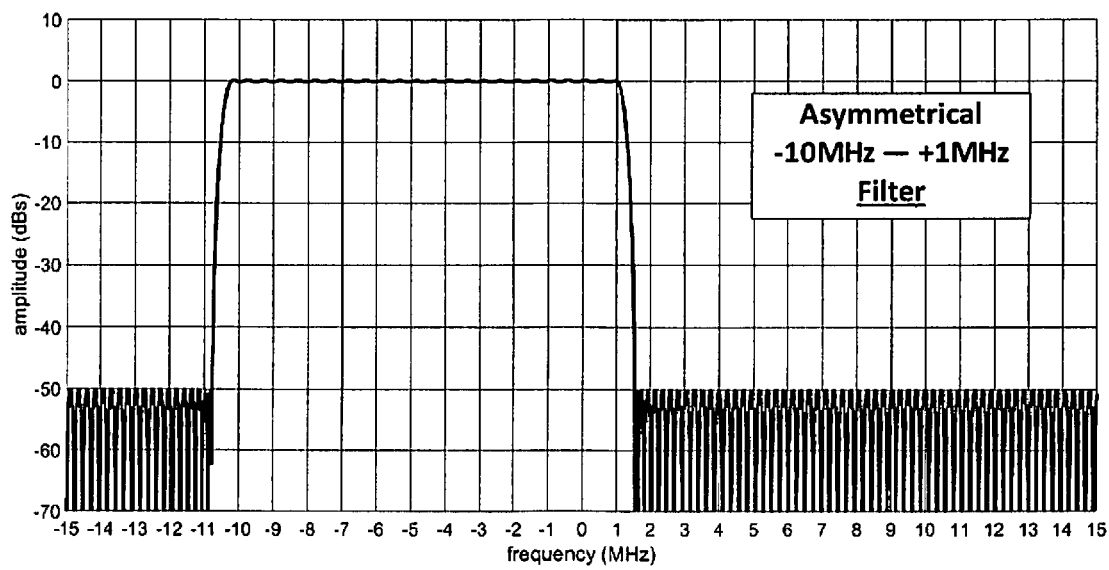

FIGS. 5A-5B illustrate exemplary plots of asymmetrical filter passbands that are particularly effective with isolating either the lower vestigial sideband or the upper vestigial sideband of the GPS L1 C/A signal, i.e., allowing only one half of the frequency band to pass through. FIG. 5A illustrates an exemplary plot of an asymmetric filter with a relatively wide passband from −1 MHz to +10 MHz, which can be used to isolate and select the upper vestigial sideband of the GPS L1 C/A signal, according to one embodiment. FIG. 5B illustrates an exemplary plot of an asymmetric filter with a relatively wide passband from −10 MHz to +1 MHz, which can be used to isolate and select the lower vestigial sideband of the GPS L1 C/A signal, according to one embodiment.

Tables 2, 3, 4A, and 4B illustrate the CNO loss associated with various symmetric and asymmetric complex filters for different GNSS signals. In each of Tables 2, 3, 4A, and 4B, CNO 1 sigma=0.1 dB, S=symmetrical, and A=asymmetrical. Table 2 below illustrates the CNO loss of the GPS L1 C/A signal caused by various symmetric and asymmetric complex filters.

TABLE 2

GPS L1 C/A

| GPS L1 C/A Target Passband | Signal | Filter type | Filter bandwidth | CNO (dB-Hz) (loss in dBs) |
|---|---|---|---|---|
| Full bandwidth | L1 C/A | S | −10 MHz-+10 MHz (FIG. 3A) | 49.9 (reference) |
| Medium bandwidth | L1 C/A | S | −3 MHz-+3 MHz (FIG. 3B) | 49.7 (−0.2 dB) |
| Narrow bandwidth, LTE band 13 | L1 C/A | S | −1 MHz-+1 MHz (FIG. 3C) | 49.6 (−0.4 dB) |
| Vestigial bandwidth | L1 C/A | A | −1 MHz-+10 MHz (FIG. 5A) | 49.6 (−0.3 dB) |
| Half bandwidth, LTE 13 or 14 | L1 C/A | A | 0 MHz-+10 MHz | 48.8 (−1.1 dB) |
| Medium half bandwidth | L1 C/A | A | 0 MHz-+3 MHz | 48.8 (−1.1 dB) |
| Narrow half bandwidth, LTE band 14 | L1 C/A | A | 0 MHz-+1 MHz | 48.5 (−1.4 dB) |
| Vestigial half bandwidth, LTE band 14 | L1 C/A | A | −0.5 MHz-+10 MHz | 49.7 (−0.2 dB) |
| Vestigial narrow bandwidth, LTE band 13 and 14 | L1 C/A | A | −0.5 MHz-+1 MHz | 49.3 (−0.6 dB) |

Table 3 below illustrates the CNO loss of the GPS L5 signal caused by various symmetric and asymmetric complex filters.

TABLE 3

GPS L5

| GPS L5 Target Passband | Signal | Filter type | Filter bandwidth | CNO (in dB-Hz) (loss in dBs) |
|---|---|---|---|---|
| full bandwidth | L5 | S | −10 MHz-+10 MHz (FIG. 3A) | 49.5 (reference) |
| narrow bandwidth | L5 | S | −3 MHz-+3 MHz (FIG. 3B) | 47.7 (−1.8 dB) |
| vestigial sideband | L5 | A | −1 MHz-+10 MHz (FIG. 5A) | 47.6 (−1.9 dB) |
| half bandwidth | L5 | A | 0 MHz-+10 MHz | 46.9 (−2.6 dB) |
| narrow half bandwidth | L5 | A | 0 MHz-+3 MHz | 45.2 (−4.3 dB) |

Table 4A below illustrates the CNO loss of the Galileo E1 BOC(1,1) signal caused by various symmetric and asymmetric complex filters.

TABLE 4A

Galileo BOC(1, 1)

| Galileo E1 BOC(1, 1) Target Passband | Signal | Filter type | Filter bandwidth | CNO (dB-Hz) (loss in dBs) |
|---|---|---|---|---|
| full bandwidth | BOC(1, 1) | S | −10 MHz-+10 MHz (FIG. 3A) | 49.9 (reference) |
| narrow bandwidth | BOC(1, 1) | S | −3 MHz-+3 MHz (FIG. 3B) | 49.6 (−0.3 dB) |
| half bandwidth | BOC(1, 1) | A | 0 MHz-+10 MHz | 47.1 (−2.8 dB) |
| narrow half bandwidth | BOC(1, 1) | A | 0 MHz-+3 MHz | 46.8 (−3.1 dB) |

Table 4B below illustrates the CNO loss of the Galileo E1 CBOC(1,6) signal caused by various symmetric and asymmetric complex filters.

TABLE 4B

Galileo CBOC(1, 6)

| Galileo E1 CBOC(1, 6) Target Passband | Signal | Filter type | Filter bandwidth | CNO (in dB-Hz) (loss in dBs) |
|---|---|---|---|---|
| full bandwidth | CBOC(1, 6) | S | −10 MHz-+10 MHz (FIG. 3A) | 49.9 (reference) |
| narrow bandwidth | CBOC(1, 6) | S | −3 MHz-+3 MHz (FIG. 3B) | 49.4 (−0.5 dB) |
| half bandwidth | CBOC(1, 6) | A | 0-+10 MHz | 47.1 (−2.8 dB) |
| narrow half bandwidth | CBOC(1, 6) | A | 0-+3 MHz | 46.5 (−3.4 dB) |

According to one embodiment, the present system/method matches the implementation of the asymmetric filtering to the known characteristics of the wideband interferer. For example, the interferer characteristics of LTE bands 13 and 14 are known, and thus the filter characteristics appropriate for mitigating the wideband interference of LTE bands 13 and 14 may be stored in advance and applied when the LTE band 13 and/or LTE band 14 signal is detected.

Figure 6:
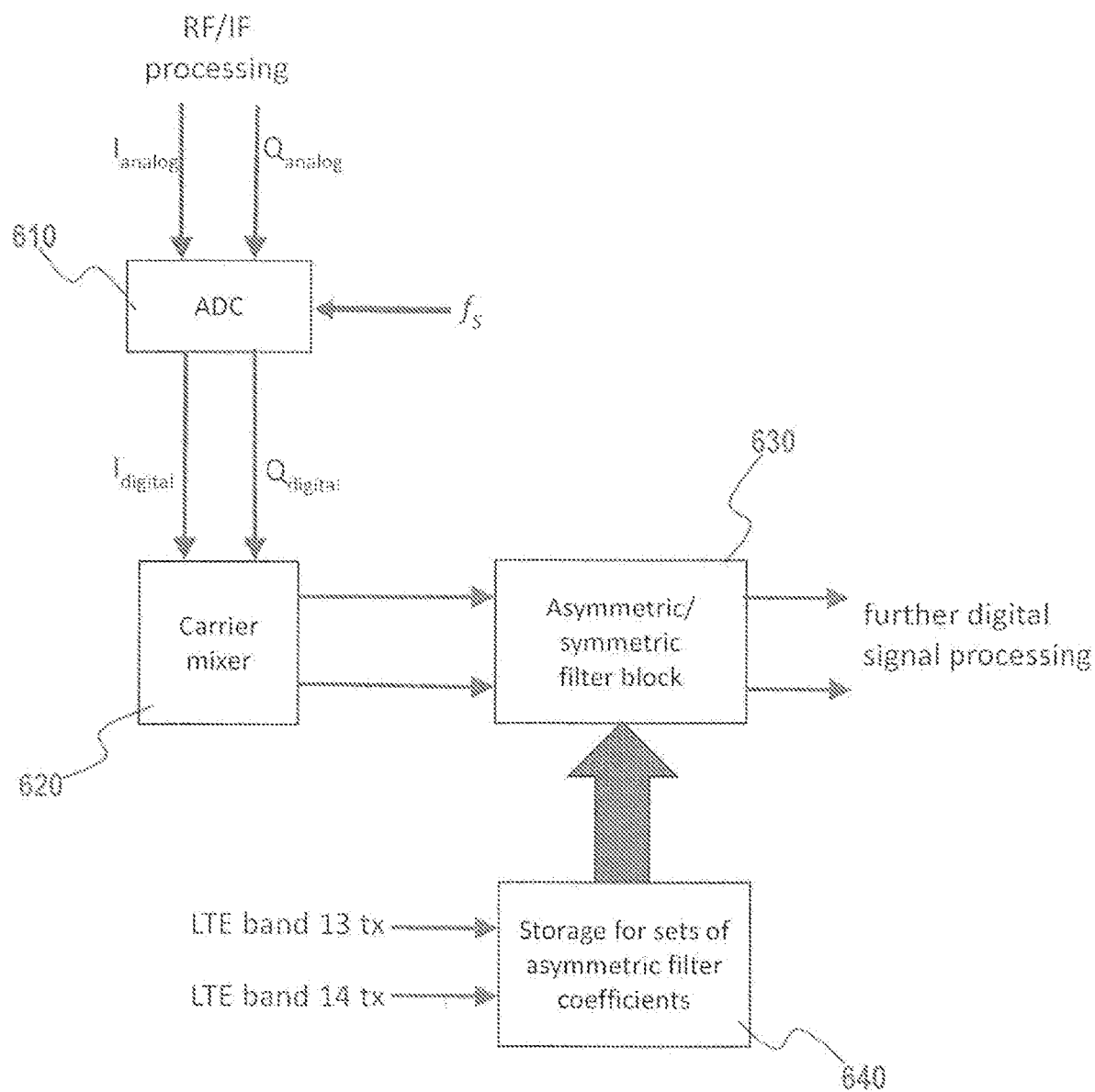
FIG. 6 illustrates an exemplary block diagram of the relevant components in the receive chain of a GNSS receiver which applies pre-stored asymmetric filter coefficients to mitigate LTE band 13 and/or LTE band 14 wideband interference, according to one embodiment.

FIG. 6 illustrates an exemplary block diagram of the relevant components in the receive chain of a GNSS receiver which applies pre-stored asymmetric filter coefficients to mitigate LTE band 13 and/or LTE band 14 wideband interference, according to one embodiment. The GNSS receive chain shown in FIG. 6 includes analog-to-digital converter (ADC) 610, carrier mixer 620, asymmetric/symmetric filter block 630, and storage 640 for the sets of coefficients for asymmetric/symmetric filter block 630.

After processing the received GNSS signal by bringing it down from the received carrier radiofrequency (RF) to an intermediate frequency (IF) so the received GNSS signal can be processed by the remaining components of the receive chain, the analog complex signal (having in-phase $I_{analog}$ and quadrature $Q_{analog}$ components) is input to ADC 610. ADC 610 converts the complex analog $I_{analog}$, $Q_{analog}$ signal to a complex digital $I_{digital}$, $Q_{digital}$ signal, by sampling using sampling frequency $f_s$. Complex digital $I_{digital}$, $Q_{digital}$ signal is mixed with the desired/appropriate carrier signal by carrier mixer 620 in order to start separating out and isolating the desired signal (such as the transmitted GPS L1 C/A signal) from the rest of the received signal.

The appropriately mixed complex $I_{digital}$, $Q_{digital}$ signal is input into asymmetric/symmetric filter block 630, where one of a symmetric filter and a programmable asymmetric filter will be applied to the input appropriately mixed complex $I_{digital}$, $Q_{digital}$ signal in this embodiment. For example, if no LTE band 13 or LTE band 14 interference is detected, the standard symmetric filter may be applied to the input complex $I_{digital}$, $Q_{digital}$ signal by asymmetric/symmetric filter block 630. However, if interference from LTE band 13 is detected, control signal LTE 13 band transmitter (tx) input into storage 640 is turned on, resulting in a first set of filter coefficients being taken from storage 640 and supplied to asymmetric/symmetric filter block 630, which applies the first set of filter coefficients to the programmable asymmetric filter, thereby creating the appropriate passband for the input complex $I_{digital}$, $Q_{digital}$ signal to mitigate any LTE band 13 wideband interference. Similarly, if interference from LTE band 14 is detected, control signal LTE 14 band tx input into storage 640 is turned on, resulting in a second set of filter coefficients being taken from storage 640 and supplied to asymmetric/symmetric filter block 630, which applies the second set of filter coefficients to the programmable asymmetric filter, thereby creating the appropriate passband for the input complex $I_{digital}$, $Q_{digital}$ signal to mitigate any LTE band 14 wideband interference.

Depending on the embodiment, the asymmetric filter used may be based on a complex bandpass filter design such as a complex finite impulse response (FIR) filter design (e.g., a single-stage single-rate FIR, a multi-rate multistage FIR) or an infinite impulse response (IIR) filter (e.g., a single-rate IIR). According to one embodiment, the present system/method includes one or more programmable asymmetric filters that may be applied to any of the received signal bands as required, as will be discussed in reference to the flowchart of FIG. 8. By contrast, preset asymmetric filters may be swapped in and out depending on the interference environment, similarly to how asymmetric/symmetric filter block 630 in FIG. 6 switches from one filter to another.

Although the present disclosure is described using bandpass filters (which have pass bands, such as those shown in FIGS. 3A-3C, 4A-4B, and 5A-5B), anyone of ordinary skill in the art would recognize that band-stop filters could be used to produce the same result. Indeed, one of ordinary skill in the art would recognize that any of the wide variety of filtering methods, based on hardware, software, or a mixture of the two, could be used in accordance with the scope of the present disclosure.

Figure 7:
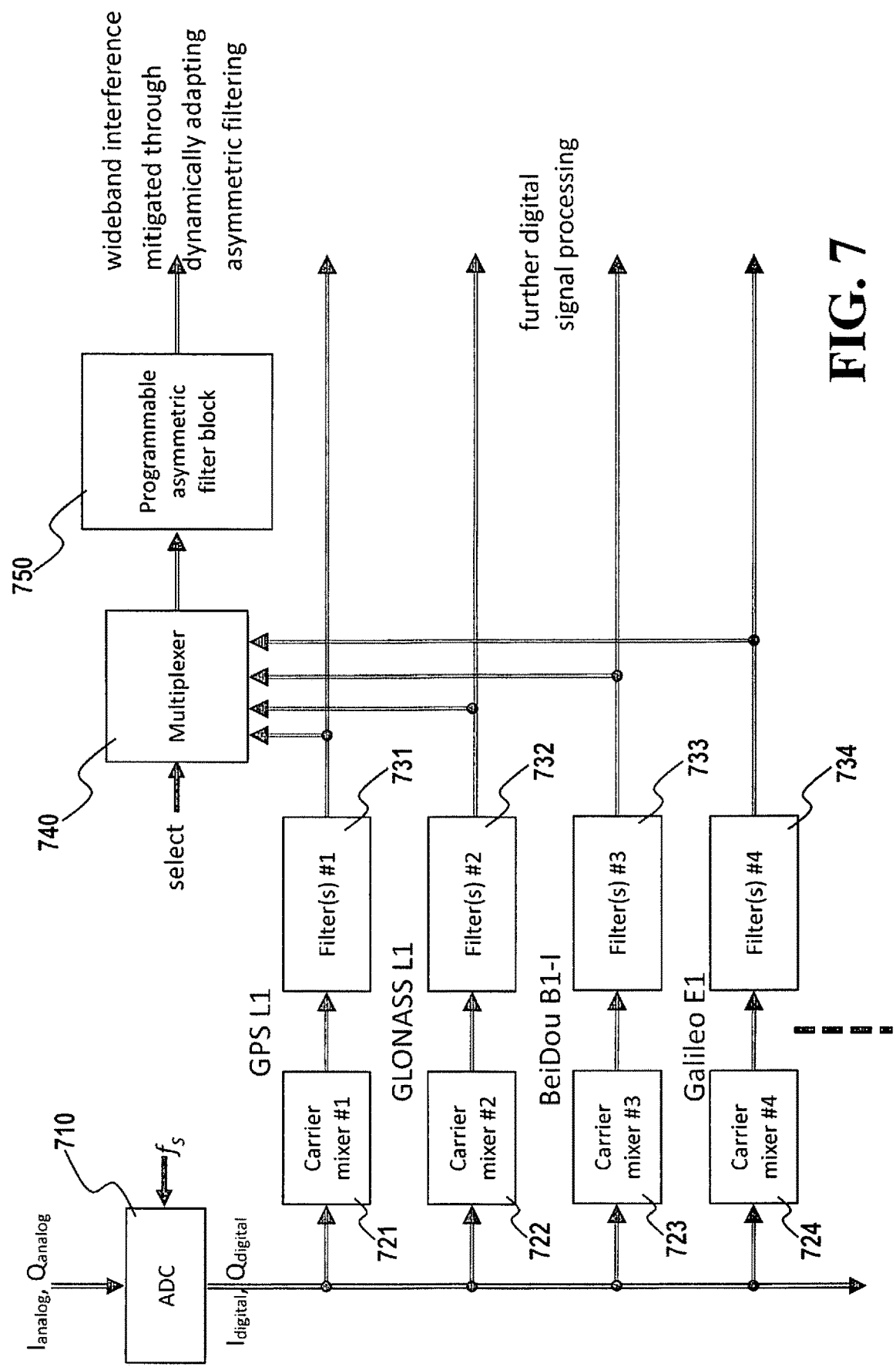
FIG. 7 illustrates an exemplary block diagram of the relevant components in the receive chain of a GNSS receiver with an adaptable programmable asymmetric filter block for dynamically filtering signals from different GNSS systems, according to one embodiment.

FIG. 7 illustrates an exemplary block diagram of the relevant components in the receive chain of a GNSS receiver with an adaptable programmable asymmetric filter block which can be used for dynamically filtering signals from different GNSS systems, according to one embodiment. The receive chain in FIG. 7 includes an ADC 710 performing substantially the same function as ADC 610 in FIG. 6, but its complex $I_{digital}$, $Q_{digital}$ signal output is input into a plurality of different individual signal paths for separating out different GNSS signals. As can be seen in FIG. 7, each GNSS signal has its own path of similar components for performing the appropriate processing for each GNSS signal.

More specifically, the top component path includes carrier mixer #1 721 which mixes the complex $I_{digital}$, $Q_{digital}$ signal with the desired/appropriate carrier signal in order to start separating out the desired OPS L1 signal and filter(s) #1 731 which further isolates and separates out the desired GPS L1 C/A signal. As would be understood by one of ordinary skill in the art, many other components would be needed to, for example, generate the nominal GPS L1 signal for mixing by carrier mixer #1 721, and that filter #1 731 would either include or be supplemented by multiple filters and correlators, as well as modules for applying, for example, the fast Fourier transform (FFT) and/or the inverse FFT (IFFT) as part of the processing, in order to implement/perform any of the wide variety of processes requiring multiple stages for isolating, separating, synchronizing, etc., the desired target signal (in this case, the GPS L1 signal).

The next component path includes carrier mixer #2 722 which mixes the complex $I_{digital}$, $Q_{digital}$ signal with the target GLONASS L1 carrier signal and filter(s) #2 732 to isolate and separate out the received GLONASS L1 signal. The third component path includes carrier mixer #3 723 which mixes the complex $I_{digital}$, $Q_{digital}$ signal with the target BeiDou B1-1 carrier signal and filter(s) #3 733 to isolate and separate out the received BeiDou B1-1 signal, while the fourth component path includes carrier mixer #4 724 which mixes the complex $I_{digital}$, $Q_{digital}$ signal with the target Galileo E1 carrier signal and filter(s) #4 734 to isolate and separate out the received Galileo E1 signal. As indicated by the dotted line beneath the fourth component path, additional component paths may be added in parallel with the four component paths shown in FIG. 7 to isolate and separate out other received GNSS signals to which the adaptable programmable asymmetric filter block according to this embodiment could be applied to as well.

To find more details regarding the parallel components for receiving multiple GNSS signals, see U.S. Pat. No. 9,482,760, of which the present inventor is the sole inventor and which is incorporated herein by reference in its entirety.

Each of the GPS L1 signal, the GLONASS L1 signal, the BeiDou B1-1, and Galileo E1 signal are output in the frequency domain by filter(s) #1 731, filter(s) #2 732, filter(s) #3 733, and filter(s) #4 734, respectively, on their own signal paths for further digital signal processing, as shown in FIG. 7. However, according to this embodiment, each of those signal paths also have their own separate inputs into multiplexer 740 (i.e., multiplexer 740 receives each of the rough, correlated, frequency domain signals). Multiplexer 740 has a select control signal that selects which of the GPS L1 signal, the GLONASS L1 signal, the BeiDou B1-1, and the Galileo E1 signal is input to programmable asymmetric filter block 750 for asymmetric filtering. In this embodiment, if symmetric filtering is sufficient (and no asymmetric filtering is necessary), it is performed by one of filter(s) #1 731, filter(s) #2 732, filter(s) #3 733, and filter(s) #4 734.

In this embodiment, programmable asymmetric filter block 750 is capable of dynamically changing and adapting the asymmetric filtering characteristics to fit the specific requirements of the selected input signal, i.e., the GPS L1 signal, the GLONASS L1 signal, the BeiDou B1-1, or the Galileo E1 signal. Although a method of creating the appropriate coefficients for any specific asymmetric filter is discussed below, one of ordinary skill in the art would understand that programmable asymmetric filter block 750 may be implemented in a wide variety of ways, including having a combination of multiple preset asymmetric filters and multiple programmable asymmetric filters in parallel so as to best provide the most, or perhaps the most likely, asymmetric filter passbands as quickly as possible, and/or having multiple stages of symmetric filters and asymmetric filters which when passed through in series (and perhaps using different hardware paths) result in the desired passband, and so on.

Accordingly, the output of programmable asymmetric filter block 750 in this embodiment is the appropriate asymmetrically filtered version of the GNSS signal, ready for further digital signal processing. However, the present disclosure is not so limited. For example, other embodiments may use individual programmable asymmetric filter blocks in each component path (i.e., for each GNSS signal), where it could be implemented as part of a feedback loop including one or more typical symmetric filters, where either type of filter may be applied, and the feedback is used for dynamic adaptation of the programmable asymmetrical filters.

Figure 8:
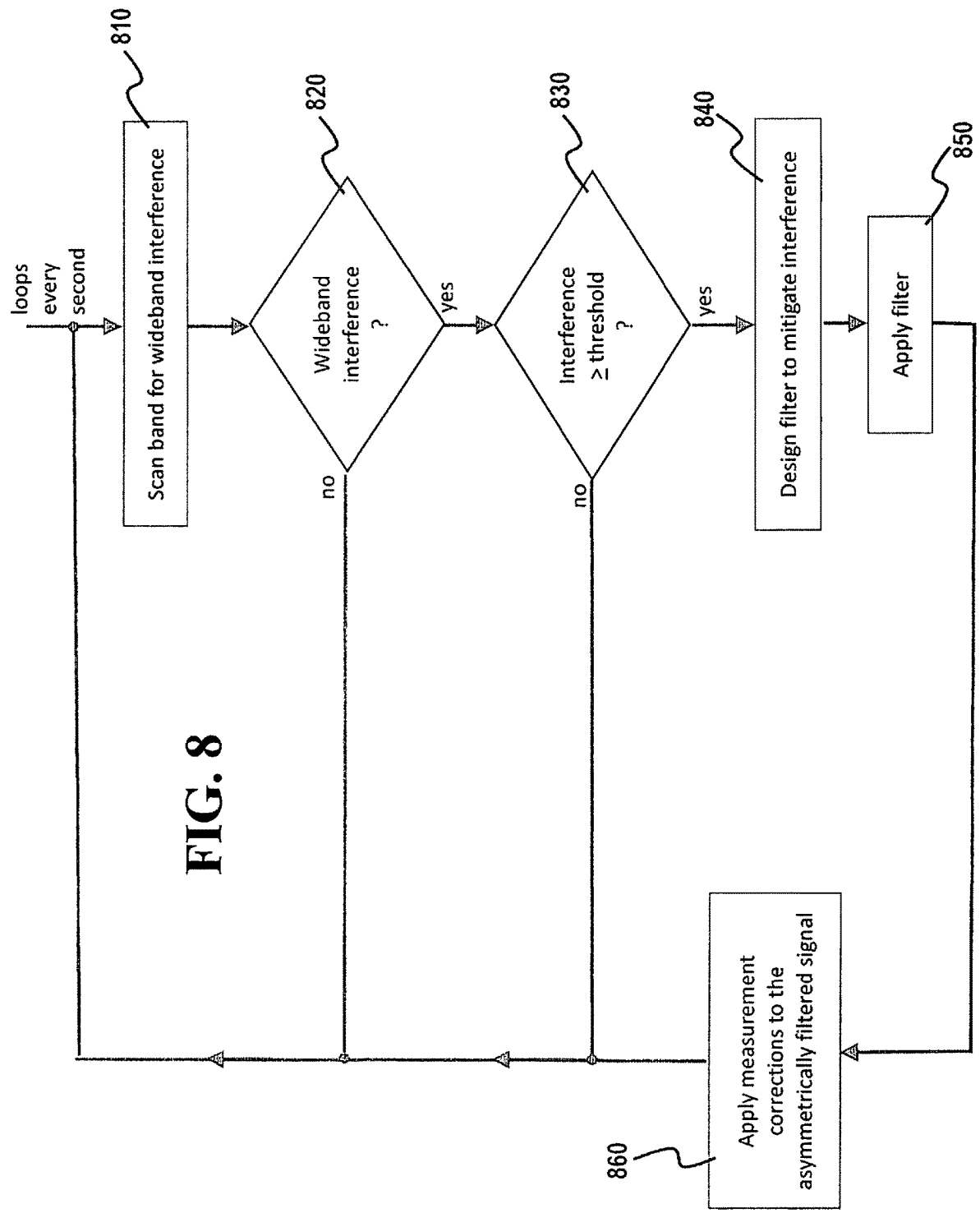
FIG. 8 illustrates an exemplary flowchart of a dynamic, real-time asymmetric filtering method, according to one embodiment.

FIG. 8 illustrates an exemplary flowchart of a dynamic, real-time asymmetric filtering method, according to one embodiment. As indicated in FIG. 8, this embodiment loops through its steps approximately every second. At 810, the present system/method scans or analyzes the received signal band to detect possible wideband interference. At 820, the present system/method determines whether wideband interference is detected. If not, the present system/method loops back to repeat the process at 810. If wideband interference is detected at 820, the present system/method determines whether the detected wideband interference is greater than or equal to a threshold at 830.

If the detected wideband interference is less than the threshold at 830, the present system/method loops back to the start to begin again—i.e., no mitigation efforts are made regarding the detected wideband interference. Although wideband interference may be detected in 820, the detected wideband interference might not have a large enough effect to justify the resources for mitigation (like designing a filter in 840) and so it is ignored. The reason for this is practical, and is based on simple loss vs. gain considerations. Detected wideband interference may have so little impact in terms of error in the final PVT/PNT that the use of hardware/software to apply the mitigation process may not be worth the resources. It is a trade-off between the resources consumed in applying mitigation and the (possible) impact of the detected wideband interference. In any event, in this embodiment, a threshold is used to separate the detected wideband interference which is worth the resources from the detected wideband interference which is not worth the resources.

However, as would be understood by one of ordinary skill in the art, a number of different factors having greater or lesser impact have to go into determining a particular threshold for a particular implantation. For example, if the desired/target signal is the GPS L1 C/A signal, one pertinent factor is that the structure of the spreading code for that particular signal is such that it has a "natural" immunity to interference the further the interference is from the center/nominal frequency. Interference at the center frequency may cause 3 dB loss in CNO, whereas interference 1.5 MHz away from the center frequency overlaps with the first L1 C/A signal sidelobe which has 13 dB more resistance to interference (in these circumstances, the resistance is approximately proportional to the signal level at the frequency offset). Thus the threshold may be set such that if the wideband interference is offset by several MHz and has the roughly the same signal power as the thermal noise (i.e., background noise), the effect of such wideband interference is not worth the resources for mitigating it.

If the detected wideband interference is greater than or equal to the threshold at 830, the present system/method designs a filter to mitigate the specific detected wideband interference at 840. As mentioned above, and known to one of ordinary skill in the art, there are various ways to design such an asymmetric filter.

In this embodiment, the asymmetric filter is made by first creating a symmetric FIR filter of the same bandwidth as the desired asymmetric filter. For example, if the desired asymmetric filter should have a passband of −1 MHz to +10$f_x$, the desired bandwidth of the initial symmetric filter is 11 $f_x$. The passband in a symmetric filter is necessarily symmetric around 0, so the 11 MHz passband of the initial complex FIR filter is from −5.5 MHz to +5.5$f_x$. The complex FIR filter coefficients, numbered by index n=0, . . . , N, are then each multiplied by $e^{j*f_t*\pi*(0:N)}$, where $f_t$ is desired frequency translation (in this case, $f_t$=+4.5 MHz to move the 11 MHz passband over to −1 MHz to +10$f_x$), as shown in Equation (1) below:

$$C_{asymmetric}[n] = C_{symmetric}[n] \times e^{j*f_t*\pi*(0:N)} \quad (1)$$

where $C_{symmetric}[n]$ is the nth complex coefficient of the symmetric filter and $C_{asymmetric}[n]$ is the nth complex coefficient of the asymmetric filter which will have a passband offset by $f_r$. In other words, each set of symmetric complex coefficients is complex rotated by a single value taken from (0:N). Thus, the first coefficient is rotated by phase zero (no rotation); the second coefficient is rotated by phase $f_r \times \pi$; the third coefficient is rotated by phase $f_r \times \pi \times 2$; the fourth coefficient is rotated by phase $f_r \times \pi \times 3$; etc.

After the filter for mitigating the specific detected wideband interference is designed at 840, it is applied to the received signal at 850. The output asymmetrically filtered signal is then corrected/altered, if/as necessary, at 860.

The corrections at 860 are based on findings concerning the possible effect of the present system/method on the code range and/or carrier phase of the asymmetrically filtered signal. As described in more detail in U.S. Provisional Patent Application Ser. No. 62/661,380 filed on Apr. 23, 2018 ("the '380 Prov."), from which the present application claims priority and which is incorporated herein by reference in its entirety, it was found that continual looping (i.e., switching/designing new filters) may cause a carrier phase offset and/or change in code range. See, e.g., pages 20-23 and FIGS. 24-29 of the '380 Prov. On the other hand, the '380 Prov. also explained that maintaining a constant phase offset is comparatively easy and minor, while there is no peak offset if the initial complex symmetric FIR filter is the same length as the final asymmetric filter which is applied to the signal at 850.

Moreover, the impact on any measurements (i.e., change in code range or carrier phase) of particular asymmetrically filtered signal can be computed and corrected in real time via software at 860. In addition, any CNO corrections can also be made at 860.

Figure 9:
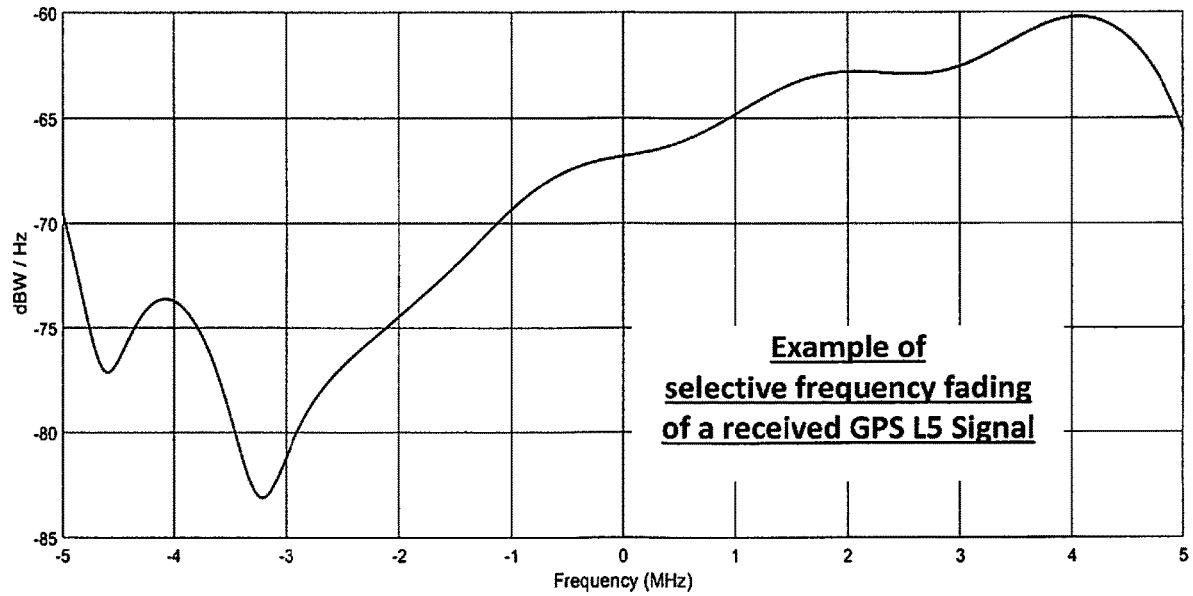
FIG. 9 is an exemplary plot illustrating the frequency selective fading of a received GPS L5 signal, according to one embodiment.

FIG. 9 is an exemplary plot illustrating the frequency selective fading of a received OPS L5 signal. As shown by the example in FIG. 9, different parts of the spectrum are impacted by very different selective fading. There is substantially different signal loss in each half of the spectrum. However, according to an embodiment of the present disclosure, the spectrum of the received signal may be split into at least two parts by asymmetrically filtering out each part to be considered in isolation, which may be helpful. For example, if the spectrum of the signal is divided into two halves by asymmetric filtering, the earliest arriving half can be used to identify the earliest arriving peak. As detailed on page 17 and in FIGS. 14-20 of the '380 Prov., asymmetrically filtering a signal such that only a half band remained still preserved the characteristics of the peaks such that range and rate measurements could be made.

Figure 10:
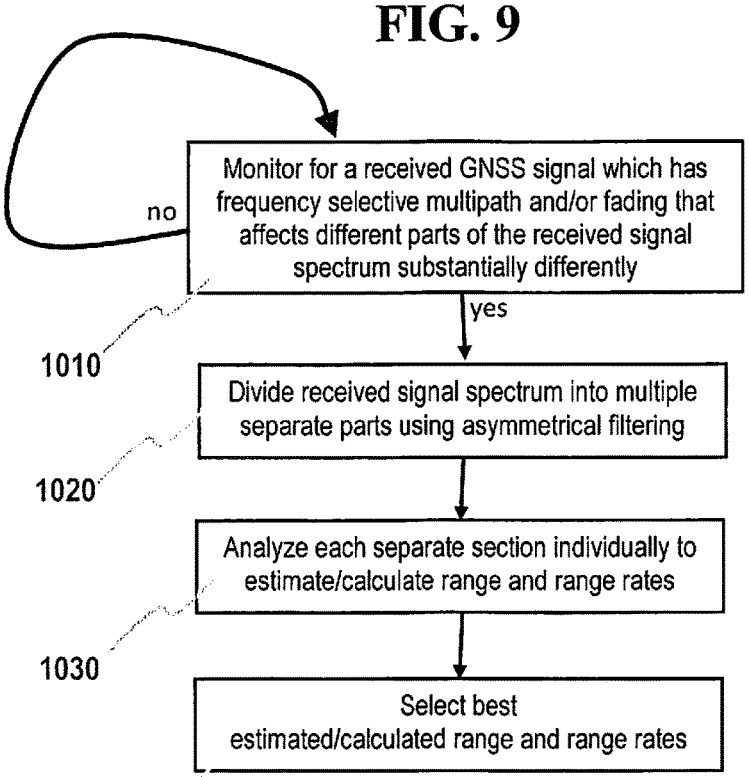
FIG. 10 illustrates an exemplary flowchart of a method for mitigating the effects of frequency selective fading, according to one embodiment.

FIG. 10 illustrates an exemplary flowchart of a method for mitigating the effects of frequency selective fading, according to one embodiment. At 1010, the present system/method continually monitors to detect whether a received GNSS signal has frequency selective multipath and/or fading that affects different parts of the received signal spectrum substantially differently. If such a received GNSS signal is detected in 1010, the whole received signal spectrum is divided up into individual separate sections by applying asymmetrical filtering at 1020. For example, the spectrum may be divided into separate upper and lower parts. Each section and, optionally, the whole spectrum as well, is used to estimate/calculate range and range rates at 1030. At 1040, the impact of each section can be observed and the present system/method selects the best estimated/calculated range and range rates (e.g., earliest arriving correlation peak for range measurement). The present system provides asymmetrical FIR filtering to an otherwise symmetrical GNSS signal to mitigate wideband interference, such that the GNSS receiver is more resistant to wideband jammers.

Figure 11:
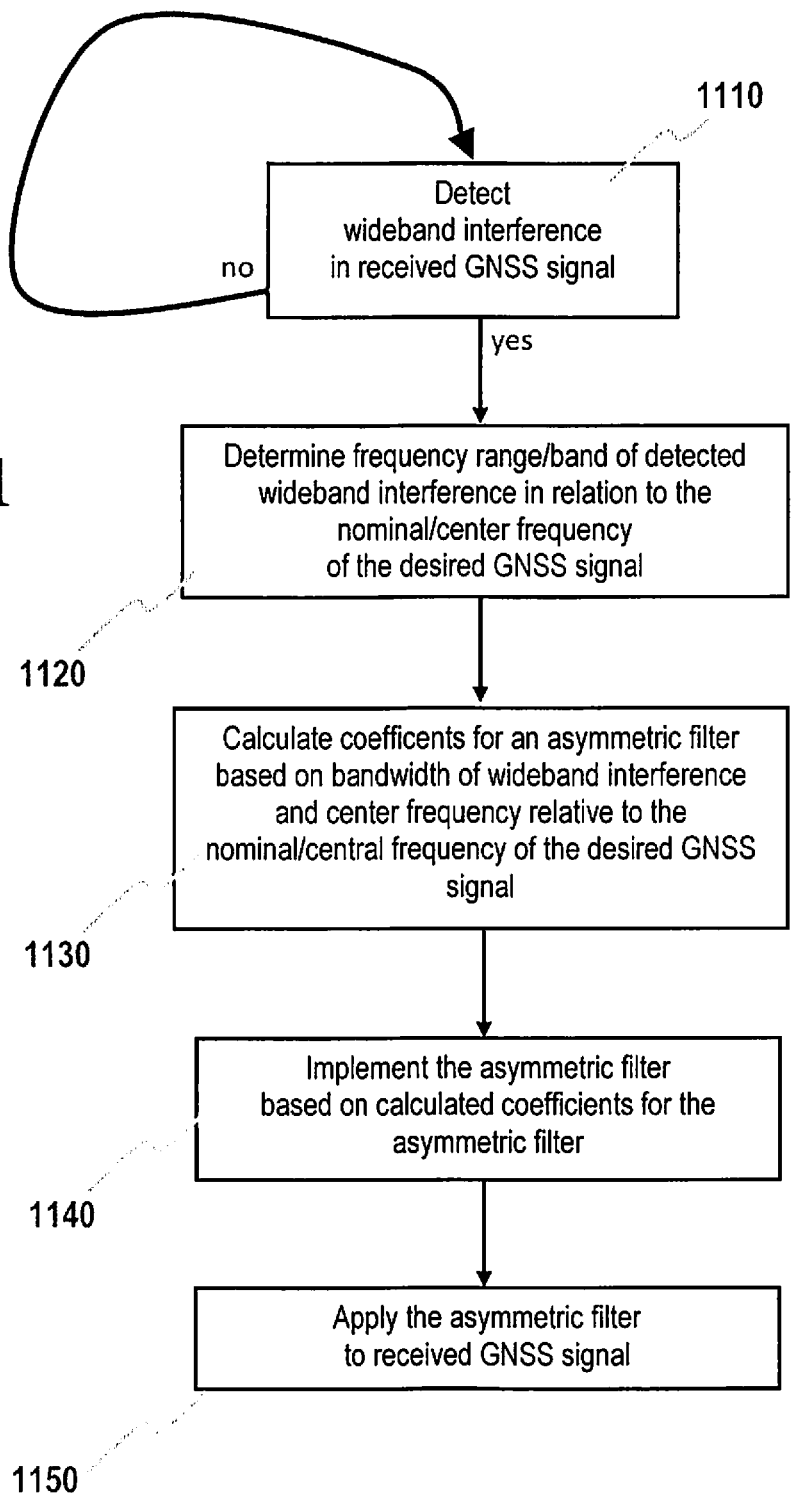
FIG. 11 illustrates an exemplary flowchart of a method for mitigating the effects of wideband interference on a received GNSS signal using an asymmetric band-stop filter, according to one embodiment.

FIG. 11 illustrates an exemplary flowchart of a method for mitigating the effects of wideband interference on a received GNSS signal using an asymmetric band-stop filter, according to one embodiment. In other words, by contrast to the method in FIG. 8, this method uses a band-stop filter to negate the wideband interference rather than a bandpass filter to isolate a desirable part of the received GNSS signal separate from the wideband interference.

At 1110, the present system/method detects wideband interference in a received GNSS signal. At 1120, the present system/method determines the frequency range/band of the wideband interference in relation to the nominal/center frequency of the desired GNSS signal. It is assumed in this embodiment that the wideband interference is not symmetric around the nominal/center frequency of the desired GNSS signal. At 1130, the present system/method calculates coefficients for an asymmetric filter (e.g., an asymmetric band-stop filter) from the coefficients of a symmetric filter having a stop band with the same bandwidth as the wideband interference based on the frequency offset of the wideband interference from the nominal/center frequency and the bandwidth of the wideband interference. At 1140, the present system/method implements the asymmetric filter based on the calculated coefficients for the asymmetric filter. At 1150, the present system/method applies the asymmetric filter to the received GNSS signal, thereby mitigating the wideband interference whose location corresponds with the stop band of the asymmetric band-stop filter.

As described above, the present system/method according to one embodiment provides asymmetric filtering in a GNSS receiver to reduce wideband interference. According to one embodiment, the present system/method includes detecting an interfering signal having a certain frequency band, translating a filtering passband of a filter (e.g., a finite impulse response (FIR) filter) based on the detected frequency band, and providing filtering on the received GNSS signal based on the translated filtering passband. The GNSS receiver may further store a set of filter coefficients for the expected interferer so that the filtering passband is translated based on the filter coefficients in real-time and the filter is programmable. In one embodiment, the present system filters out half of the spectrum of a received GNSS signal (instead of the whole spectrum) such that the receiver can mitigate the effects of frequency selective multipath/fading. The detected interfering signal may be in-band with respect to the desired signal. The present system may select either a low side or high side local oscillator (LO) based on where in frequency the interfering signal is detected.

According to one embodiment, different receivers have different frequency conversion values, in other words different digital intermediate frequencies (IFs). For example, a receiver may have a digital IF of 4 MHz or −7 MHz. The asymmetric filtering is expected to be with respect to such IF frequencies. The filter characteristics given here are with respect to 0 Hz but can be translated to any receiver's digital IF. In one embodiment, asymmetric filtering can isolate half the band (e.g. for L5) such that the receiver can observe frequency selective multipath with either half band and/or the whole band (can be done in parallel).

According to one embodiment, the filter design is implemented in the receiver such that any wideband interferer can be accounted for in real-time (assuming some portion of the band is unaffected). This eliminates the need for storage large enough to contain all possible asymmetric filters. Optimally, a combination of stored known asymmetric filters and the ability to design new asymmetric filters may be used to mitigate wideband interference in accordance with an embodiment of the present disclosure.

As would be understood by one of ordinary skill in the art, the present disclosure is generally applicable to various types of known and/or unknown wideband interference with many combinations of interferer amplitude and bandwidth without deviating from the scope of the present disclosure.

Figure 12:
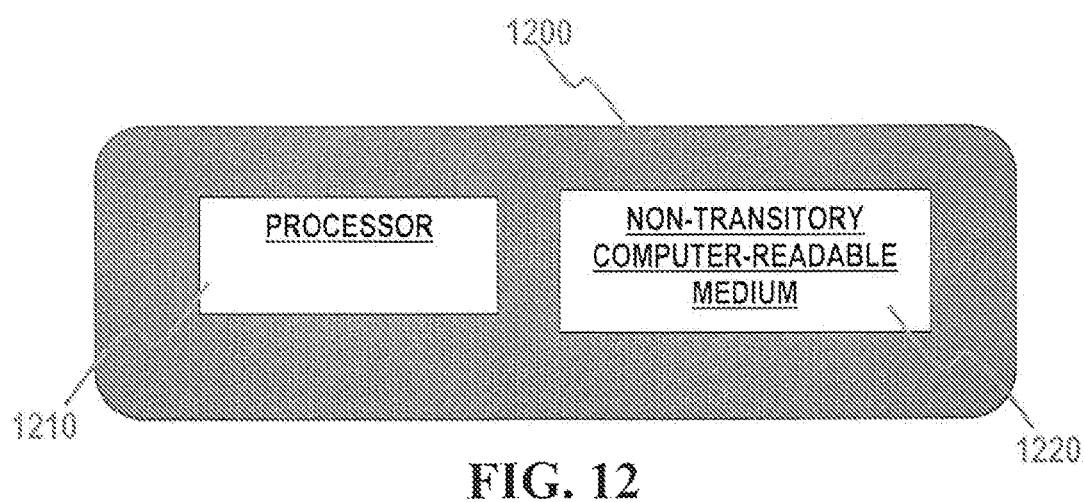
FIG. 12 illustrates an exemplary diagram of the present apparatus, according to one embodiment.

FIG. 12 illustrates an exemplary diagram of the present apparatus, according to one embodiment. An apparatus 1200 includes at least one processor 1210 and one or more non-transitory computer readable media 1220. The at least one processor 1210, when executing instructions stored on the one or more non-transitory computer readable media 1220, performs the steps of detecting wideband interference in a received target GNSS signal and applying an asymmetric filter to the received target GNSS signal to mitigate the detected wideband interference. Moreover, the one or more non-transitory computer-readable media 1220 stores instructions for the at least one processor 1210 to perform those steps.

Figure 13:
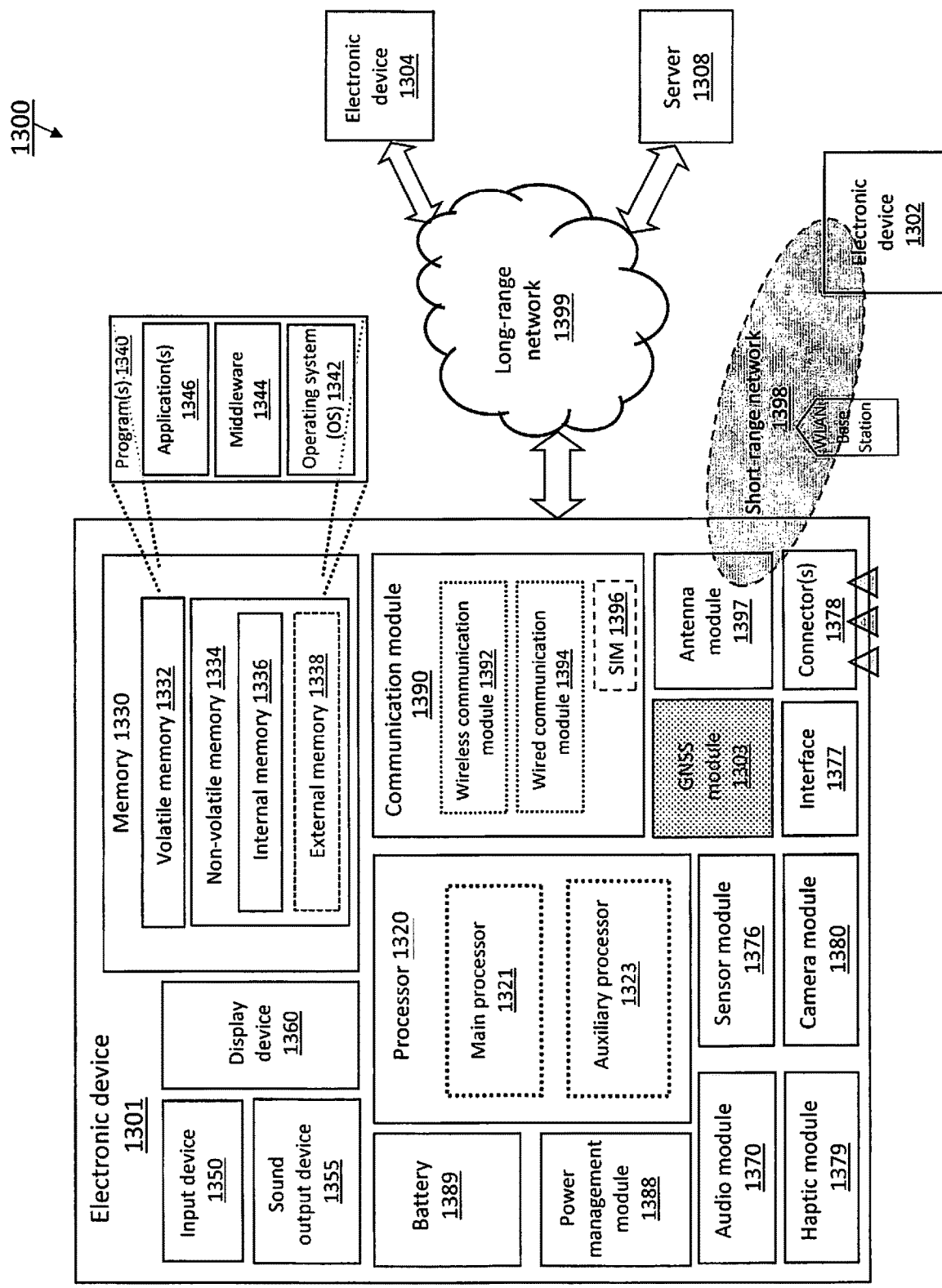
FIG. 13 illustrates an exemplary block diagram of an electronic device 1301 in a network environment 1300, according to one embodiment.

FIG. 13 is an exemplary block diagram of an electronic device 1301 in a network environment 1300, according to one embodiment. Electronic device 1301 according to one embodiment may be, for example, a portable communication device (e.g., a smart phone), a computer, a portable multimedia device, a portable medical device, a camera, a wearable device, or a home appliance. However, this is a list of examples, and an electronic device according to the present disclosure is not limited to any of those listed and/or described herein.

Referring to FIG. 13, electronic device 1301 in network environment 1300 may communicate with an external electronic device 1302 via short-range wireless communication network 1398 (or "first network"), or communicate with another external electronic device 1304 or a server 1308 via a long-range wireless communication network 1399 (or "second network").

According to one embodiment, electronic device 1301 may communicate with electronic device 1304 via server 1308. Each of electronic devices 1302 and 1304 may be different or the same type of device as electronic device 1301. According to one embodiment, all or some of the operations described herein may be executed at one or more external devices/systems (e.g., external electronic devices 1302 and 1304, or server 1308) rather than being executed by electronic device 1301. For example, electronic device 1301 may request one or more external devices/systems to perform at least part of a function or a service being performed/executed. The one or more external devices/systems receiving the request would transfer the suitable/appropriate outcome of performing at least part of a function or a service to the electronic device 1301. In this regard, cloud computing, distributed computing, and/or client-server computing technology may be used, for example, with electronic device 1301.

Electronic device 1301 includes processor 1320, memory 1330, input device 1350, sound output device 1355, display device 1360, audio module 1370, sensor module 1376, interface 1377, haptic module 1379, camera module 1380, power management module 1388, battery 1389, communication module 1390, GNSS module 1303, and antenna module 1397. In one embodiment, one or more components (e.g., haptic module 1379 or camera module 1380) may be omitted from, or one or more other components may be added to, electronic device 1301. In one embodiment, some of the components may be implemented as a single integrated circuit (IC). For example, the sensor module 1376 (e.g., a fingerprint sensor, an iris sensor, or an illuminance sensor) may be embedded in the display device 1360 (e.g., a display screen).

Electronic device 1301 has one or more internal communication and/or power transmission systems to which the one or more components in electronic device 1301 are connected for inter-component communication and/or power reception/transmission. Such systems allow the one or more components to communicate data and commands amongst themselves, as well as to provide timing, power, and other signals. Such a system may be implemented via an inter-peripheral communication scheme, such as, e.g., a bus, a general purpose input and output (GPIO), a serial peripheral interface (SPI), a mobile industry processor interface (MIPI), and/or the like, as would be understood by one of ordinary skill in the art.

Processor 1320 executes software (e.g., program 1340) to, for example, control one or more hardware/software components of the electronic device 1301, or perform various data processing or computations. As at least part of the data processing or computations, processor 1320 may, for example, load a command or data received from a component of the electronic device 1301 (e.g., sensor module 1376 or communication module 1390) in volatile memory 1332, process/execute the command or the data stored in the volatile memory 1332, and store the result in non-volatile memory 1334. Processor 1320 includes a main processor 1321 (which may include, e.g., a central processing unit (CPU) and/or an application processor (AP)), and an auxiliary processor 1323 (which may include, e.g., a graphics processing unit (GPU) and/or an image signal processor (ISP). In this embodiment, auxiliary processor 1323 is implemented separately from main processor 1321, and may be operable independently from, or in conjunction with, main processor 1321. Auxiliary processor 1323 may be adapted to consume less power than main processor 1321, to execute one or more particular functions, and/or to be a part of main processor 1321. Additionally or alternatively, main processor 1321 and/or auxiliary processor 1323 may include a sensor hub processor, a communication processor (CP), or the like.

Auxiliary processor 1323 may control at least some of the functions or states related to one or more components of the electronic device 1301 (e.g., display device 1360, sensor module 1376, and/or communication module 1390) while main processor 1321 is in an inactive state (e.g., sleep). Additionally or alternatively, auxiliary processor 1323 may control at least some of the functions or states related to one or more components of the electronic device 1301 together with main processor 1321 while the main processor 1321 is in an active state (such as, e.g., executing an application). Depending on the embodiment, one or more processors (such as, e.g., an image signal processor or a communication processor) and/or processor functions may be implemented as part of one or more components of the electronic device 1301 (such as, e.g., camera module 1380 and/or communication module 1390).

Memory 1330 stores data, for examples, generated by and/or used by one or more components of the electronic device 1301 (such as, e.g., processor 1320 or sensor module 1376). Such stored data may include, for example, software/executable instructions (e.g., program(s) 1340), input data, output data, operating parameters/instructions, and the like, as would be understood by one of ordinary skill in the art. In this embodiment, memory 1330 includes volatile memory 1332 and non-volatile memory 1334. The non-volatile memory 1334 may include an internal memory 1336 and an external memory 1338.

Program(s) 1340 stored in memory 1330 includes operating system (OS) 1342, middleware 1344, and application(s) 1346, as discussed further below in reference to FIG. 14.

Input device 1350 receives external commands or data (such as from, e.g., a user) to be used by one or more components of the electronic device 1301 (such as, e.g., processor 1320). The input device 1350 may include, for example, a microphone, a mouse, and/or a keyboard.

Sound output device 1355 outputs sound signals and may include, for example, one or more speakers that may be used for general purposes, such as playing multimedia or recording, as well as for providing the audio component of a call. According to one embodiment, the audio component of a call may be provided by a separate component and/or only partially by the speaker of sound output device 1355.

Display device 1360 provides images/video by means of, for example, one or more of a display screen, a touch screen, a hologram device, or a projector, and includes control circuitry to control the one or more of the display screen, touch screen, hologram device, or projector. According to one embodiment with a display touchscreen, the display device 1360 may include touch circuitry/sensor circuitry (e.g., a pressure sensor) adapted to detect a contact/touch/hover and/or to measure the force, trajectory, speed, relative movement in 3D space, etc., of such a detected contact/touch/hover.

Audio module 1370 converts sound into electrical signals and vice versa. Depending on the embodiment, audio module 1370 may obtain sound via input device 1350, output sound via sound output device 1355, input/output sound via headphones connected by wire to connector(s) 1378 of the electronic device 1301, input/output sound via headphones wirelessly connected to the electronic device 1301, and/or input/output sound via an external electronic device (e.g., electronic device 1302) connected by wire or wirelessly with the electronic device 1301.

Sensor module 1376 detects an environmental state (including, e.g., a state of a user) external to the electronic device 1301, and/or an operational state (e.g., power or temperature) of the electronic device 1301 and then generates an electrical signal/data value corresponding to the detected state. Sensor module 1376 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

Interface 1377 supports one or more interface/communication protocols for the electronic device 1301 to interface/communicate with a wide variety of external electronic devices. According to one embodiment, interface 1377 supports, for example, a high definition multimedia interface (HDMI), a universal serial bus (USB) interface, a secure digital (SD) card interface, an audio-based interface, a radio-based interface, and/or the like, as would be understood by one of ordinary skill in the art. Connector(s) 1378 include one or more physical connectors by which one or more external devices/objects may be physically connected with the electronic device 1301. Connector(s) 1378 may include, for example, one or more of an HDMI input, a USB input, an SD card input, an audio jack, an Ethernet plug, and/or the like, as would be understood by one of ordinary skill in the art.

Haptic module 1379 converts an electrical signal into mechanical vibration/movement to generate a tactile sensation or kinesthetic sensation for anyone holding electronic device 1301. Haptic module 1379 may include, for example, a motor, a piezoelectric element, and/or an electrical stimulator.

Camera module 1380 captures still and/or moving images/videos. Camera module 1380 may include and/or be connected with lenses, image sensors, image signal processors, lighting devices (such as flashes or light diodes), image generators for the user to see/aim the camera, and/or other circuitry, as would be well-known to one of ordinary skill in the art of implementing a photographing capability in a portable device.

Power management module 1388 manages at least one of the power input/supplied to the electronic device 1301, battery 1389, and/or the power distributed among one or more components of the electronic device 1301. Power management module 1388 may be implemented as at least part of, for example, a power management integrated circuit (PMIC). Battery 1389 may supply power to one or more components of the electronic device 1301 and may be partly or fully under control of power management module 1388. Battery 1389 may include, for example, at least one of a primary cell which is not rechargeable, a secondary cell which is rechargeable, or a fuel cell.

Communication module 1390 supports wireless communication through wireless communication module 1392 and wired communication through wired communication module 1394. For example, communication module 1390 may establish a direct communication channel between the electronic device 1301 and an external electronic device (via a wired connection using wired communication module 1394 and connector(s) 1378) and/or establish a wireless communication channel between the electronic device 1301 and the same or another external electronic device (via a wireless connection using wireless communication module 1392 and, for example, antenna module 1397). Communication module 1390 may include one or more communication processors that are operable independently from processor 1320 and are for establishing and/or maintaining wired and/or wireless communication.

Wireless communication module 1392 supports at least one of long-range wireless communication (such as, e.g., cellular network communication, wide area network (WAN) communication, and/or any other long- to mid-range communication) and short-range wireless communication (such as, e.g., near field communication (NFC), Bluetooth™, wireless LAN (WLAN) communication under any IEEE 802.11 or 802.15 standard, wireless-fidelity (Wi-Fi), infrared communication under an Infrared Data Association (IrDA) standard, ZigBEE™ and/or any other proprietary short-range communication standards, and/or any other short- to mid-range communication).

Wired communication module 1394 supports any practicable wired communication, as would be understood by one of ordinary skill in the art, such as, e.g., power line communication (PLC), Ethernet communication such as those under any IEEE 802.3 standard, optical internetworking, connecting with the Internet, and/or any other communication/networking using any sort of wire capable of carrying a signal or wired connector. Communication module 190 may be implemented as a single component (e.g., a single IC), or may be implemented as multiple components/ICs (such as, e.g., the wireless communication module 1392 and wired communication module 1394) that are separate from each other.

Communication module 1390 uses subscriber information (e.g., international mobile subscriber identity (IMSI)) stored in subscriber identification module (SIM) 1396 to identify and authenticate electronic device 1301 to a telecommunication network.

Antenna module 1397 may transmit or receive a signal and/or power to or from the outside of the electronic device 1301. Antenna module 1397 may include a plurality of antennas, where different subsets of the plurality of antennas are appropriate/suitable for each of the different antenna-based communication schemes/networks/protocols supported by communication module 1390.

GNSS module 1303 receives and processes signals from satellites from one or more GNSSs. Broadly speaking, the reception/processing of GNSS signals involves three phases: acquisition, tracking, and positional calculation, resulting in a "navigation solution"/PVT/PNT. The present location of any satellites, or Space Vehicles (SVs), in view is estimated based on the GNSS receiver's location, the time, and previously stored information concerning the orbits of the SVs in view from one or more GNSS constellations. The resulting estimated azimuth and elevation coordinates for each SV is then used to "acquire" the actual rough locations of (at least some of) the SVs using the GNSS signals presently being received. Generally, acquisition involves (1) detecting each SV signal in code delay (in most GNSS systems, each SV has its own CDMA code) and Doppler frequency; and (2) determining the rough code delay and Doppler frequency (and position) of any detected SV's. The two dimensions of code delay and Doppler frequency are often referred to as the acquisition search space.

Using the coarse data—code delay, Doppler frequency, and position—from acquisition, the received GNSS signals are fine-tuned, or more specifically "tracked" using loops, typically a delay lock loop (DLL) and a phase lock loop (PLL). Once a certain level of tracking precision is met, the data embedded in the GNSS signal can finally be decoded and used to calculate the position, velocity, and/or exact time of the present location of the GNSS receiver. These calculations are fed back into the process, thereby creating a constantly repeating loop of estimating, selecting, tracking, calculating, and updating.

Figure 14:
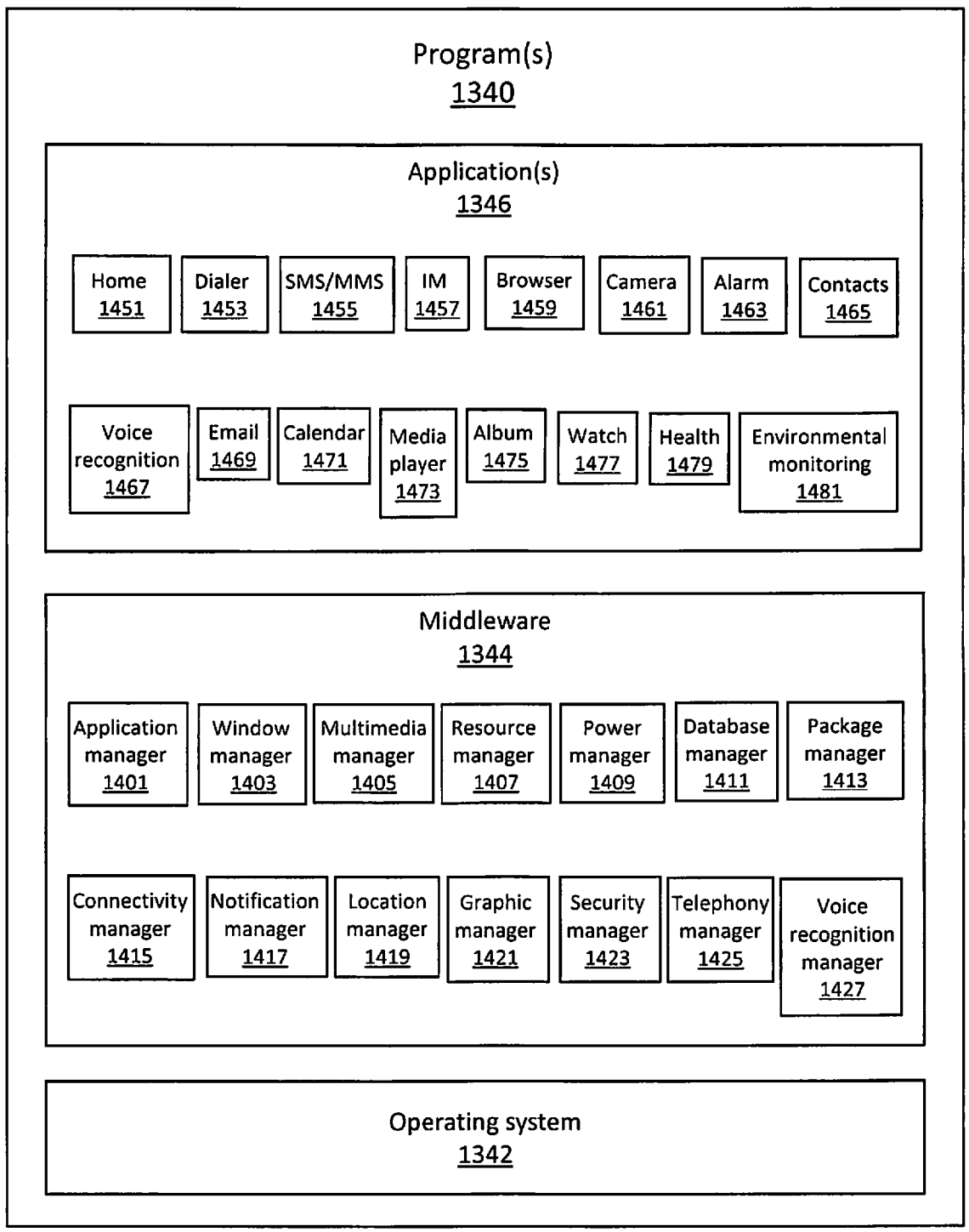
FIG. 14 illustrates an exemplary block diagram of program(s) 1340 from electronic device 1301 in FIG. 13, according to one embodiment.

FIG. 14 illustrates an exemplary block diagram of program(s) 1340 from electronic device 1301 in FIG. 13, according to one embodiment. Program(s), application(s), and other such terms may be used herein in the singular form for convenience of explanation, and are not intended as limiting in any sense.

Referring to FIG. 14, program 1340 includes at least one executable application 1346, middleware 1344, and at least one operating system (OS) 1342 to control one or more resources of electronic device 1301. OS 1342 may be any of, for example, Android®, iOS®, Windows®, Symbian®, Tizen®, or Bada™. At least part of program 1340 may be pre-loaded on electronic device 1301 during/after manufacture and/or may be downloaded from or updated by electronic device 1301 connecting to an external system/device (e.g., the electronic device 1302 or 1304, or the server 1308) before/during use.

OS 1342 controls management of one or more system resources (e.g., allocating, modifying, or deallocating processes, memory, and/or power) of electronic device 1301. Additionally or alternatively, OS 1342 may include one or more driver programs to drive components within (or connected to) electronic device 1301. For example, OS 1342 may have drivers for one or more of input device 1350, sound output device 1355, display device 1360, audio module 1370, sensor module 1376, interface 1377, haptic module 1379, camera module 1380, power management module 1388, battery 1389, communication module 1390, the subscriber identification module 1396, or antenna module 1397.

Middleware 1344 provides various functions to application 1346 such that a function or information provided from one or more resources of electronic device 1301 may be used by application 1346. Middleware 1344 includes application manager 1401, window manager 1403, multimedia manager 1405, resource manager 1407, power manager 1409, database manager 1411, package manager 1413, connectivity manager 1415, notification manager 1417, location manager 1419, graphic manager 1421, security manager 1423, telephony manager 1425, and voice recognition manager 1427.

Application manager 1401 manages the life cycle of application(s) 1346. Window manager 1403 manages one or more graphical user interface (GUI) resources that are used on a display screen. Multimedia manager 1405 identifies the format appropriate to access/play a media file, and selects a codec appropriate for the identified format to encode/decode the media file. Resource manager 1407 manages source code of application(s) 1346 and/or the memory space of memory 1330. Power manager 1409 manages/monitors the capacity, temperature, and/or power of battery 1389, and/or determines/provides power-related information to be used for the operations of electronic device 1301. According to one embodiment, power manager 1409 may interoperate with a basic input/output system (BIOS) of electronic device 1301.

Database manager 1411 generates, searches, manages, monitors, and/or modifies one or more databases which, for example, may be used by application(s) 1346. Package manager 1413 manages the installation and/or updates of any application or updates that are distributed in the form of a package file. Connectivity manager 1415 manages communication connections between electronic device 1301 and any external network/system/device. Notification manager 1417 notifies the user of the occurrence of an event (e.g., an incoming call, message, or alert). Location manager 1419 manages/monitors/distributes locational information on electronic device 1301. Graphic manager 1421 manages graphic effects to be shown on display device 1360 or other visual display.

Security manager 1423 provides system security and/or user authentication. Telephony manager 1425 manages voice/video call functions provided by electronic device 1301. Voice recognition manager 1427 provides a voice recognition and/or voice-to-text function. For example, voice recognition manager 1427 may transmit a user's voice data to server 1308, and receive, from server 1308, a command corresponding to a function to be executed on electronic device 1301 based at least in part on the voice data, or text data converted based at least in part on the voice data.

Middleware 1344, as would be understood by one of ordinary skill in the art, may turn on/off, alter/modify, delete, and/or add managers/components. At least a part of middleware 1344 may be implemented as part of OS 1342. As would be understood by one of ordinary skill in the art, middleware 1344 may include more, less, or different managers/components than those listed here.

Application(s) 1346 include home application 1451, dialer application 1453, short message service (SMS)/multimedia messaging service (MMS) application 1455, instant messaging (IM) application 1457, browser application 1459, camera application 1461, alarm application 1463, contacts application 1465, voice recognition application 1467, email application 1469, calendar application 1471, media player application 1473, album application 1475, watch application 1477, health application 1479 (e.g., for measuring the degree of workout or biometric information, such as blood sugar, of a user), and environmental monitoring application 1481 (e.g., for measuring atmospheric pressure, humidity, or temperature information).

According to one embodiment, application 1346 may further include, for example, an information exchange application and/or a device management application. The information exchange application supports information exchange between electronic device 1301 and external devices/systems/networks. The information exchange application, for example, may include a notification relay function adapted to transfer designated information/notifications corresponding to an occurrence of an event (e.g., an alert, receipt of an email, a call, an IM message, etc.) to an external electronic device currently being used by the user. Additionally or alternatively, the notification relay function may receive notification information from the external electronic device and provide the notification information to a user of electronic device 1301. The device management application would manage one or more external devices/systems. For example, the device management application may control the power (e.g., turn-on or turn-off) and one or more functions of external devices/systems (e.g., the adjustment of brightness, resolution, or focus of a camera wirelessly connected to electronic device 1301). Additionally or alternatively, the device management application may support the installation, updating, and/or deletion of one or more functions/applications on one or more external devices/systems.

The steps and/or operations described above in relation to one embodiment may occur in a different order, or in parallel, or concurrently for different epochs, etc., depending on the specific embodiment and/or implementation, as would be understood by one of ordinary skill in the art. Different embodiments may perform actions in a different order or by different ways or means. As would be understood by one of ordinary skill in the art, some drawings are simplified representations of the actions performed, their descriptions herein simplified overviews, and real-world implementations would be much more complex, require more stages and/or components, and would also vary depending on the requirements of the particular implementation. Being simplified representations, these drawings do not show other required steps as these may be known and understood by one of ordinary skill in the art and may not be pertinent and/or helpful to the present description.

Similarly, some drawings are simplified block diagrams showing only pertinent components, and some of these components merely represent a function and/or operation well-known in the field, rather than an actual piece of hardware, as would be understood by one of ordinary skill in the art. In such cases, some or all of the components/modules may be implemented or provided in a variety and/or combinations of manners, such as at least partially in firmware and/or hardware, including, but not limited to one or more application-specific integrated circuits ("ASICs"), standard integrated circuits, controllers executing appropriate instructions, and including microcontrollers and/or embedded controllers, field-programmable gate arrays ("FPGAs"), complex programmable logic devices ("CPLDs"), and the like. Some or all of the system components and/or data structures may also be stored as contents (e.g., as executable or other machine-readable software instructions or structured data) on a non-transitory computer-readable medium (e.g., as a hard disk; a memory; a computer network or cellular wireless network or other data transmission medium; or a portable media article to be read by an appropriate drive or via an appropriate connection, such as a DVD or flash memory device) so as to enable or configure the computer-readable medium and/or one or more associated computing systems or devices to execute or otherwise use or provide the contents to perform at least some of the described techniques.

Various embodiments of the present disclosure may be implemented in an integrated circuit (IC), also called a microchip, silicon chip, computer chip, or just "a chip," as would be understood by one of ordinary skill in the art, in view of the present disclosure. Such an IC may be, for example, a broadband and/or baseband modem chip.

One or more processors, simple microcontrollers, controllers, and the like, whether alone or in a multi-processing arrangement, may be employed to execute sequences of instructions stored on non-transitory computer-readable media to implement embodiments of the present disclosure. In some embodiments, hard-wired circuitry may be used in place of or in combination with software instructions. Thus, embodiments of the present disclosure are not limited to any specific combination of hardware circuitry, firmware, and/or software. More specifically, depending on the embodiment of the present disclosure, some or all of the steps and/or operations may be implemented or otherwise performed, at least in part, using one or more processors running instruction(s), program(s), interactive data structure(s), client and/or server components, where such instruction(s), program(s), interactive data structure(s), client and/or server components are stored in one or more non-transitory computer-readable media. The one or more non-transitory computer-readable media may be instantiated in software, firmware, hardware, and/or any combination thereof.

A "processor" as used herein refers to any device configured to perform one or more operations based on instructions, including, but not limited to, any general purpose processor in communication with a storage medium from which computer-readable instructions can be retrieved, any special-purpose processor configured to execute specific types of instructions (such as a Digital Signal Processor (DSP)), any special-purpose processor where some or all of the instructions are hard-wired into the actual processor design, any combination thereof, and/or any other type of processor. A processor as used herein may take any form, from a simple micro-controller to a completely self-contained computing system having a bus, memory controller, cache, etc., to a group or cluster of computing devices networked together to provide greater processing capability (e.g., distributed computing). A processor as used herein may have one or more cores, and a multi-core processor used to implement one embodiment of the present disclosure may be symmetric or asymmetric. A processor as used herein may include, without limitation, one or more ASICs, standard integrated circuits, controllers executing appropriate instructions, and including microcontrollers and/or embedded controllers, FPGAs, CPLDs, microprocessors, and the like.

The term "non-transitory computer-readable medium" as used herein refers to any medium that stores instructions which may be provided to a processor for execution. Such a medium may take many forms, including but not limited to, non-volatile and volatile media. Common forms of non-transitory computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, EEPROM, any other memory chip or cartridge, or any other medium on which instructions which can be executed by a processor are stored.

Thus, methods according to embodiments of the present disclosure may be implemented by devices constructed to perform the operations (such as hardware circuits), or implemented as programs and/or higher-level instructions to be provided to one or more processors for performance/implementation (such as instructions stored in a non-transitory memory), and/of that includes machine-level instructions stored in, e.g., firmware or non-volatile memory. Some or all of any system components and/or data structures may also be stored as contents (e.g., as executable or other non-transitory machine-readable software instructions or structured data) on a non-transitory computer-readable medium (e.g., as a hard disk; a memory; a computer network or cellular wireless network or other data transmission medium; or a portable media article to be read by an appropriate drive or via an appropriate connection, such as a DVD or flash memory device) so as to enable or configure the computer-readable medium and/or one or more associated computing systems or devices to execute or otherwise use or provide the contents to perform at least some of the described techniques.

Accordingly, embodiments of the present disclosure may be implemented in a wide variety of computing architectures and environments, as would be understood by one of ordinary skill in the art. One or more logical operations of embodiments of the present disclosure may be implemented as: (1) a sequence of computer implemented steps, operations, or procedures running on one or more general use programmable circuits, (2) a sequence of computer implemented steps, operations, or procedures running on one or more specific-use programmable circuits; and/or (3) interconnected machine modules or program engines within one or more general use and/or specific-use programmable circuits. One or more processors used to perform one or more steps and/or operations in accordance with embodiments of the present disclosure may also perform other functions, steps, and operations neither considered nor discussed herein (e.g., the one or more processors being multi-functional and/or capable of multi-tasking).

Depending on the embodiment of the present disclosure, some or all of the steps and/or operations may be implemented or otherwise performed, at least in part, on a portable device. "Portable device" and/or "mobile device" as used herein refers to any portable or movable electronic device having the capability of receiving wireless signals, including, but not limited to, multimedia players, communication devices, computing devices, navigating devices, etc. Thus, mobile devices include (but are not limited to) user equipment (UE), laptops, tablet computers, portable digital assistants (PDAs), mp3 players, handheld PCs, instant messaging devices (IMD), cellular telephones, global navigational satellite system (GNSS) receivers, watches, or any such device which can be worn and/or carried on one's person.

While certain embodiments have been described, it will be understood that various modifications can be made without departing from the scope of the present disclosure. Thus, it will be apparent to those of ordinary skill in the art that the present disclosure is not limited to any of the embodiments described herein, but rather has a coverage defined only by the appended claims and their equivalents.

What is claimed is:

1. A method for a global navigation satellite system (GNSS) receiver, comprising:
   detecting asymmetric wideband interference in a received target GNSS signal in relation to a center frequency of a desired GNSS signal;
   determining an asymmetric filter to mitigate the detected asymmetric wideband interference, based on whether a source of the detected asymmetric wideband interference is known or unknown, the asymmetric filter having a passband that includes but is not centered on the center frequency of the desired GNSS signal, resulting in a filtered upper half and a filtered lower half of the received target GNSS signal being asymmetrical with respect to the center frequency of the desired GNSS signal;
   applying the asymmetric filter to the received target GNSS signal mitigating the detected asymmetric wideband interference and outputting an asymmetrically filtered signal; and
   correcting at least one of a carrier phase offset and a change in code range in the asymmetrically filtered signal.,
   wherein the asymmetric filter is determined differently for known and unknown sources of the detected asymmetric wideband interference.

2. The method of claim 1, wherein the asymmetric filter is one of a bandpass filter and a band-stop filter.

3. The method of claim 1, wherein the source of the detected asymmetric wideband interference is known, and the asymmetric filter is a stored filter.

4. The method of claim 3, wherein the stored asymmetric filter is one of a plurality of stored asymmetrical filters, wherein each stored asymmetrical filter is for mitigating one or more known or detected wideband interference sources.

5. The method of claim 1, wherein the asymmetric filter is a programmable filter.

6. The method of claim 5, wherein the asymmetric filter is programmed by a set of filter coefficients.

7. The method of claim 6, further comprising:
   determining the set of filter coefficients based at least on the detected wideband interference.

8. The method of claim 7, wherein the source of the asymmetric wideband interference is known, and the set of filter coefficients is one of a plurality of stored sets of filter coefficients, wherein each set of filter coefficients is for mitigating one or more known or detected wideband interference sources.

9. The method of claim 7, wherein the source of the asymmetric wideband interference is not known, and determining the set of filter coefficients based at least on the detected wideband interference comprises:
   calculating each of the set of filter coefficients based on an offset and bandwidth of the detected wideband interference.

10. The method of claim 9, wherein calculating each of the set of filter coefficients based on the offset and bandwidth of the detected wideband interference comprises:
    generating an initial set of filter coefficients for a symmetric filter having a pass band with a bandwidth desired for the asymmetrical filter; and
    calculating each of the set of filter coefficients based on a calculation using each of the initial set of filter coefficients for the symmetric filter.

11. The method of claim 10, wherein the calculation uses the following equation:

$$C_{asymmetric}[n]=C_{symmetric}[n]\times e^{j*f_t\pi}(0:N)$$

wherein:

n=the index for the set of complex coefficients, where n=(0, 1, . . . , N) and N is the total number of filter coefficients;

$C_{symmetric}[n]$=the nth complex coefficient of the set of N initial filter coefficients of the symmetric filter;

$C_{asymmetric}[n]$=the nth complex coefficient of the set of N filter coefficients of the asymmetric filter; and $f_t$=frequency translation; the offset from the center frequency of the desired GNSS signal to the desired passband of the asymmetrical filter.

12. A global navigation satellite system (GNSS) receiver, comprising:

one or more non-transitory computer-readable media; and at least one processor which, when executing instructions stored on one or more non- transitory computer readable media, performs the steps of:

detecting asymmetric wideband interference in a received target GNSS signal in relation to a center frequency of a desired GNSS signal;

determining an asymmetric filter to mitigate the detected asymmetric wideband interference, based on whether a source of the detected asymmetric wideband interference is known or unknown, the asymmetric filter having a passband that includes but is not centered on the center frequency of the desired GNSS signal, resulting in a filtered upper half and a filtered lower half of the received target GNSS signal being asymmetrical with respect to the center frequency of the desired GNSS signal;

applying the asymmetric filter to the received target GNSS signal mitigating the detected asymmetric wideband interference and outputting an asymmetrically filtered signal; and correcting at least one of a carrier phase offset and a change in code range in the asymmetrically filtered signal., wherein the asymmetric filter is determined differently for known and unknown sources of the detected asymmetric wideband interference.

13. The GNSS receiver of claim 12, wherein the asymmetric filter is one of a bandpass filter and a band-stop filter.

14. The GNSS receiver of claim 12, wherein the source of the detected asymmetric wideband interference is known, and the asymmetric filter is one of a plurality of stored asymmetrical filters, wherein each stored asymmetrical filter is for mitigating one or more known or detected wideband interference sources.

15. The GNSS receiver of claim 12, wherein the asymmetric filter is a programmable filter programmed by a set of filter coefficients.

16. The GNSS receiver of claim 15, wherein the at least one processor which, when executing instructions stored on one or more non-transitory computer readable media, further performs the step of:

determining the set of filter coefficients based at least on the detected wideband interference.

17. The GNSS receiver of claim 16, wherein the source of the detected asymmetric wideband interference is not known, and determining the set of filter coefficients based at least on the detected wideband interference comprises:

calculating each of the set of filter coefficients based on an offset and bandwidth of the detected wideband interference.

18. The GNSS receiver of claim 17, wherein calculating each of the set of filter coefficients based on an offset and bandwidth of the detected wideband interference comprises:

generating an initial set of filter coefficients for a symmetric filter having a pass band with a bandwidth desired for the asymmetrical filter; and calculating each of the set of filter coefficients based on a calculation using each of the initial set of filter coefficients for the symmetric filter.

19. The GNSS receiver of claim 18, wherein the calculation uses the following equation:

$$C_{asymmetric}[n]=C_{symmetric}[n]\times e^{j*f_y\pi}(0:N)$$

wherein:

n=the index for the set of complex coefficients, where n=(0, 1, . . . , N) and N is the total number of filter coefficients;

$C_{symmetric}[n]$=the nth complex coefficient of the set of N initial filter coefficients of the symmetric filter;

$C_{asymmetric}[n]$=the nth complex coefficient of the set of N filter coefficients of the asymmetric filter; and $f_y$=frequency translation; the offset from the center frequency of the desired GNSS signal to the desired passband of the asymmetrical filter.

20. The GNSS receiver of claim 12, wherein a received signal comprising the target GNSS signal comprises at least one of a global positioning system (GPS) signal, a GLObalnaya NAvigatsionnaya Sputnikovaya Sistema (GLONASS) signal, a Galileo system signal, a BeiDou system signal, a quasi-zenith satellite system (QZSS) signal, and an Indian regional navigational satellite system (IRNSS) signal.

* * * * *